US012604693B2

(12) United States Patent
  Kohei et al.

(10) Patent No.: US 12,604,693 B2
(45) Date of Patent: Apr. 14, 2026

(54) METHOD OF MANUFACTURING CHIPS

(71) Applicant: DISCO CORPORATION, Tokyo (JP)

(72) Inventors: Takumi Kohei, Tokyo (JP); Suguru Hiraiwa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 358 days.

(21) Appl. No.: 18/479,958

(22) Filed: Oct. 3, 2023

(65) Prior Publication Data

US 2024/0145307 A1      May 2, 2024

(30) Foreign Application Priority Data

Oct. 27, 2022    (JP) ................................. 2022-172409

(51) Int. Cl.
  *H01L 21/78*         (2006.01)
  *H01L 21/04*         (2006.01)

(52) U.S. Cl.
  CPC .......... *H01L 21/78* (2013.01); *H01L 21/0475* (2013.01)

(58) Field of Classification Search
  CPC ....................................................... H01L 21/78
  See application file for complete search history.

(56) References Cited

U.S. PATENT DOCUMENTS

| | | | | |
|---|---|---|---|---|
| 2022/0399234 A1* | 12/2022 | Chuang | ................ | H01L 21/268 |
| 2024/0424705 A1* | 12/2024 | Sugiyama | ............ | B26D 1/1575 |
| 2025/0083358 A1* | 3/2025 | Kobayashi | ............. | B28D 5/022 |

FOREIGN PATENT DOCUMENTS

| | | |
|---|---|---|
| JP | 1174228 A | 3/1999 |
| JP | 2013058653 A | 3/2013 |

* cited by examiner

*Primary Examiner* — Yu-Hsi D Sun
(74) *Attorney, Agent, or Firm* — Greer Burns & Crain Ltd.

(57)       ABSTRACT

A method of manufacturing a plurality of chips by dividing a workpiece having a substrate harder than a monocrystalline Si substrate includes a cut groove forming step of, while holding the workpiece on a holding table with a surface of the workpiece being exposed, cutting the workpiece along each of projected dicing lines with a first cutting blade as it is vibrating at a frequency in the ultrasonic band, to form a cut groove in the workpiece such that the cut groove extends from the surface of the workpiece and terminates short of another surface of the workpiece, and a dividing step of, while holding the workpiece on the holding table with the other surface of the workpiece being exposed, cutting off an uncut residual portion from the workpiece along each of the lines with a second cutting blade to divide the workpiece into a plurality of chips.

7 Claims, 20 Drawing Sheets

METHOD OF MANUFACTURING CHIPS

BACKGROUND OF THE INVENTION

Field of the Invention

The present invention relates to a method of manufacturing a plurality of chips, e.g., device chips, from a workpiece having a substrate harder than a monocrystalline silicon (Si) substrate, by dividing the workpiece along a grid of projected dicing lines established on the workpiece.

Description of the Related Art

To cut workpieces such as semiconductor wafers having monocrystalline Si substrates or the like, it has been known in the art to use a cutting blade to cut a workpiece along a grid of projected dicing lines or streets established on a face side of the workpiece (see, for example, Japanese Patent Laid-open No. Hei 11-74228).

For example, while the face side of the workpiece is being exposed and a reverse side thereof is being held under suction on a holding table, the cutting blade as it is rotating at a high speed has its lower end placed in a position lower than the reverse side of the workpiece, and then, the holding table is processing-fed with cutting water such as pure water being supplied to the cutting blade. The cutting blade now cuts the workpiece along the direction in which the holding table is moved, forming a cut groove that extends in the workpiece from the face side to the reverse side thereof.

When the cutting blade cuts the workpiece in this way, chippings may occur in regions near the cut plane at the face side of the workpiece and regions near the cut plane at the reverse side of the workpiece. A cutting blade including abrasive grains having a relatively small average particle diameter may be used in order to reduce the size and number of those chippings. Since swarf is easier to remove from the face side of the workpiece by the action of the cutting water supplied thereto, the cutting blade including the abrasive grains having the relatively small average particle diameter is effective to reduce the size and number of the chippings on the face side of the workpiece.

However, as less cutting water is supplied to the reverse side of the workpiece than to the face side thereof, making the swarf harder to remove from the reverse side of the workpiece, the cutting blade including the abrasive grains having the relatively small average particle diameter tends to be clogged and loaded soon on the reverse side of the workpiece, and to become less efficient in cutting the workpiece on the reveres side. As a result, the workpiece is likely to have more and larger chippings at the reverse side.

There has been proposed, as a solution to the above difficulties, a method of cutting a workpiece with a cutting blade by, instead of cutting the workpiece fully thereacross all the way from the face side to the reverse side of the workpiece with the cutting blade, forming a first cut groove, i.e., a half-cut groove, in the workpiece that has a predetermined depth from the face side of the workpiece and that is short of the reverse side thereof, overturning the workpiece, and forming a second cut groove in the workpiece that extends from the reverse side of the workpiece to the bottom of the first cut groove (see, for example, Japanese Patent Laid-open No. 2013-58653).

Monocrystalline substrates made of silicon carbide (SiC), sapphire, or the like are harder than monocrystalline substrates of Si. It is comparatively difficult, though not completely impossible, to cut such high-hardness substrates with a cutting blade including abrasive grains having a relatively small average particle diameter.

SUMMARY OF THE INVENTION

The present invention has been made in view of the above problems. It is an object of the present invention to provide a method of manufacturing chips by dividing a workpiece including a substrate harder than a monocrystalline Si substrate into a plurality of chips while reducing the number and size of chippings that occur in face and reverse sides of the workpiece when it is divided.

In accordance with an aspect of the present invention, there is provided a method of manufacturing chips by dividing a workpiece having a substrate harder than a monocrystalline Si substrate along a grid of projected dicing lines. The method includes a cut groove forming step of, while holding the workpiece on a holding table such that a surface of the workpiece is exposed, cutting the workpiece along each of the projected dicing lines with a first cutting blade as it is vibrating at a frequency in an ultrasonic band, to form a cut groove in the workpiece such that the cut groove extends from the surface of the workpiece and terminates short of another surface of the workpiece that is positioned opposite the surface thereof, and a dividing step of, after the cut groove forming step, while holding the workpiece on the holding table such that the other surface of the workpiece is exposed, cutting off an uncut residual portion from the workpiece along each of the projected dicing lines with a second cutting blade different from the first cutting blade to divide the workpiece into a plurality of chips.

In accordance with another aspect of the present invention, there is provided a method of manufacturing chips by dividing a workpiece having a substrate harder than a monocrystalline Si substrate along a grid of projected dicing lines. The method includes a cut groove forming step of, while holding the workpiece on a holding table such that a surface of the workpiece is exposed, cutting the workpiece along each of the projected dicing lines with a first cutting blade as it is vibrating at a frequency in an ultrasonic band, to form a cut groove in the workpiece such that the cut groove extends from the surface of the workpiece and terminates short of another surface of the workpiece that is positioned opposite the surface thereof, and a dividing step of, after the cut groove forming step, while holding the workpiece on the holding table such that the surface of the workpiece is exposed, cutting off an uncut residual portion from the workpiece along each of the projected dicing lines with a second cutting blade different from the first cutting blade to divide the workpiece into a plurality of chips.

Preferably, the substrate includes a substrate of SiC.

Preferably, the other surface of the workpiece is a face side of the workpiece, the projected dicing lines are established on the face side and demarcate a plurality of rectangular areas on the face side, with devices provided in the respective rectangular areas, the surface of the workpiece is a reverse side of the workpiece, the workpiece has a metal layer disposed on the reverse side thereof, the cut groove forming step includes cutting the substrate and the metal layer to form the cut groove that extends from the reverse side of the workpiece, and the dividing step includes cutting off the uncut residual portion from the face side of the workpiece.

Preferably, the second cutting blade has an edge thickness larger than an edge thickness of the first cutting blade, and the dividing step includes cutting the workpiece in order to increase a width of the cut groove.

Preferably, the second cutting blade has abrasive grains whose average particle diameter is smaller than an average particle diameter of abrasive grains of the first cutting blade.

Preferably, the cut groove forming step includes a cutting position detecting step of capturing an image of the other surface of the workpiece with an infrared camera from the surface of the workpiece and detecting at least one of the projected dicing lines on the basis of the captured image.

Preferably, the holding table used in the cut groove forming step has a holder including at least a portion that is transparent to visible light from a face side to a reverse side thereof, and the cut groove forming step includes a cutting position detecting step of capturing an image of the other surface of the workpiece through the holder with a visible light camera and detecting at least one of the projected dicing lines on the basis of the captured image.

With the methods of manufacturing chips according to the aspect and the other aspect of the present invention, since the first cutting blade as it is vibrating at a frequency in the ultrasonic band cuts the workpiece along each of the projected dicing lines in the cut groove forming step, the first cutting blade can cut the workpiece even though it has abrasive grains having a relatively small average particle diameter. In the dividing step after the cut groove forming step, the second cutting blade cuts off the uncut residual portion left to form another cut groove that extends to the bottom of the cut groove along each of the projected dicing lines, dividing the workpiece into a plurality of chips.

The uncut residual portions formed in the cut groove forming step contain cracks developed due to vibrations produced at the frequency in the ultrasonic band, and hence the workpiece can be cut with the second cutting blade including abrasive grains having a relatively small average particle diameter. Consequently, even though the second cutting blade has abrasive grains having the relatively small average particle diameter, it can divide the workpiece that includes the substrate harder than a monocrystalline Si substrate, into a plurality of chips. Further, the number and size of chippings near the surface and the other surface of the workpiece are reduced compared with a situation where the workpiece is cut fully thereacross all the way and a situation where the cutting blade is not vibrated at a frequency in the ultrasonic band when the cutting blade forms half-cut grooves in the workpiece.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 12A through 12F are enlarged plan views of an Si surface of an SiC substrate that has been divided by a method of manufacturing a plurality of device chips according to a comparative example;

DETAILED DESCRIPTION OF THE PREFERRED EMBODIMENTS

First Embodiment

Figure 1:
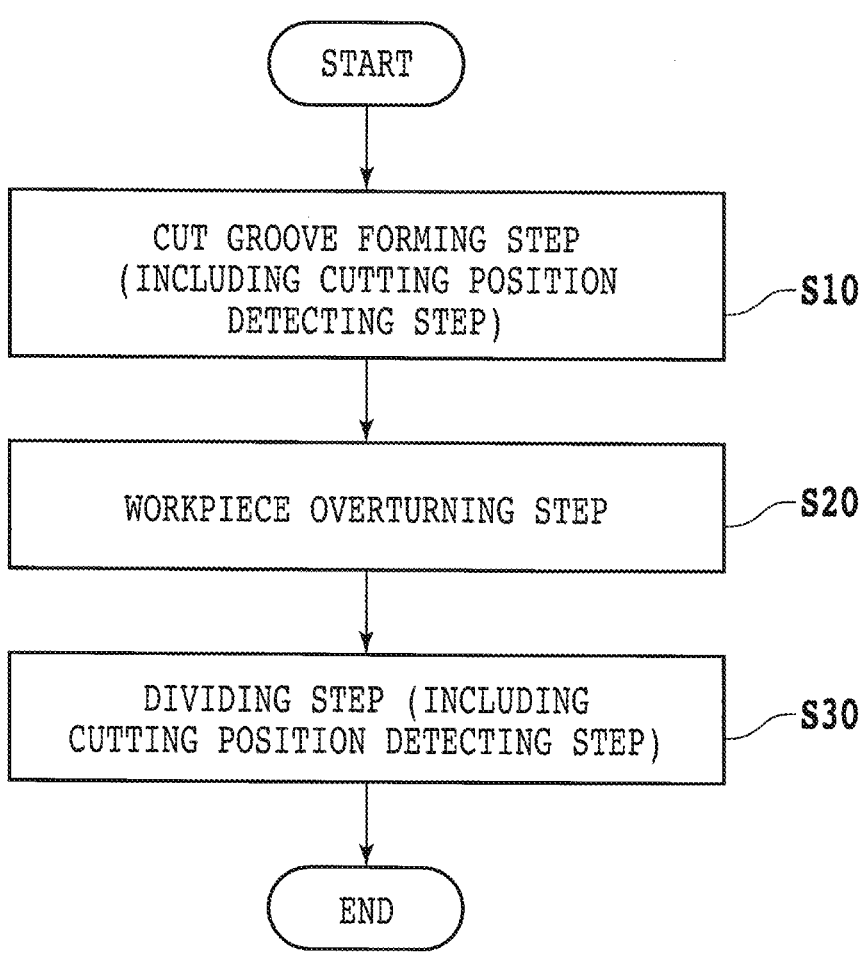
FIG. 1 is a flowchart of a method of manufacturing a plurality of device chips according to a first embodiment of the present invention.

A first embodiment of the present invention will be described below with reference to the accompanying drawings. FIG. 1 is a flowchart of a method of manufacturing a plurality of device chips, i.e., chips, 33 (see FIG. 10B) according to the first embodiment. According to the first embodiment, a disk-shaped workpiece 11 (see FIG. 2A) is divided into the device chips 33 by the method as it performs a cut groove forming step S10, a workpiece overturning step S20, and a dividing step S30 successively. First, the workpiece 11 will be described below with reference to FIGS. 2A and 2B.

Figure 2A:
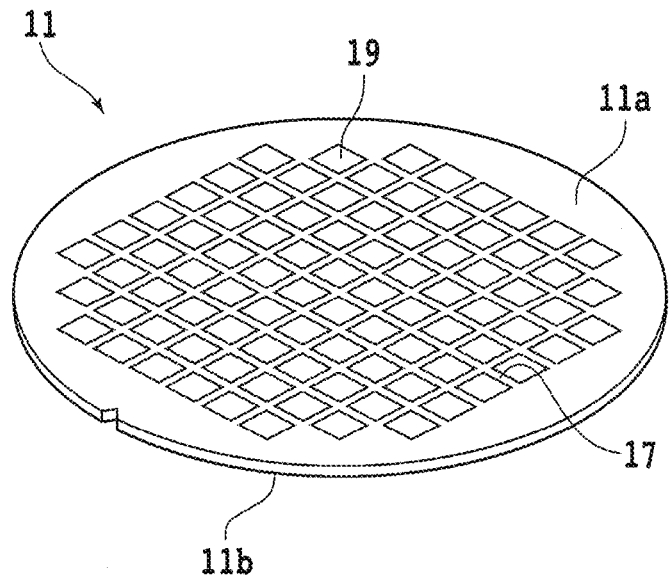
FIG. 2A is a perspective view of a workpiece.

FIG. 2A illustrates the workpiece 11 in perspective. The workpiece 11 has a monocrystalline SiC substrate, i.e., an SiC substrate, 13 (see FIG. 8A) that is harder than a monocrystalline Si substrate. The hardness of the workpiece 11 is assessed by the Mohs scale of hardness, for example. The Mohs hardness of a monocrystalline Si substrate is indicated by 7, whereas the Mohs hardness of a monocrystalline SiC substrate is indicated by 9. As illustrated in FIG. 2A, the workpiece 11, i.e., the monocrystalline SiC substrate 13, has a notch defined in an outer circumferential portion thereof to represent the crystal orientation thereof. The workpiece 11 may alternatively have an orientation flat instead of the notch.

Figure 8A:
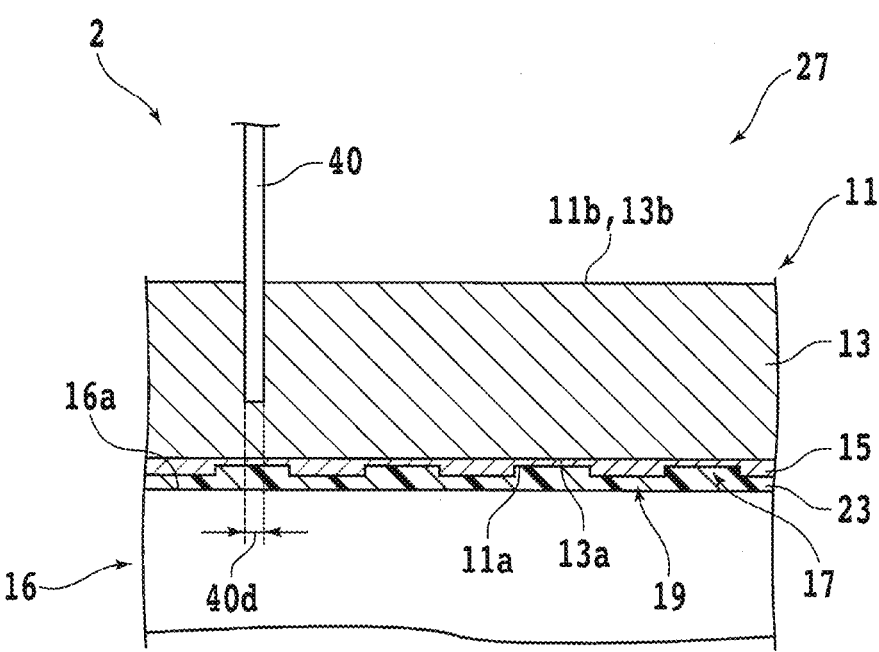
FIG. 8A is an enlarged fragmentary side elevational view, partly in cross section, illustrating the cut groove forming step.

The substrate of the workpiece 11 is not limited to the SiC substrate 13. The workpiece 11 may instead have another substrate that is harder than the monocrystalline Si substrate, such as a sapphire substrate whose Mohs hardness is indicated by 9 or a monocrystalline gallium nitride (GaN) substrate, i.e., a GaN substrate, whose Mohs hardness is indicated by 9. As illustrated in FIG. 8A, the SiC substrate 13 has an Si-surface 13a, i.e., an silicon-terminated surface, and a C-surface 13b, i.e., a carbon-terminated surface, that is opposite to the Si-surface 13a. The Si-surface 13a lies on a face side (another surface) 11a of the workpiece 11. The workpiece 11 also includes a circuit layer 15 disposed on the face side 11a in contact with the Si-surface 13a. The circuit layer 15 includes a metal interconnect layer and a low-dielectric-constant insulating layer (also referred to as a low-k material layer) that are alternately disposed on the face side 11a. The workpiece 11 is free of a circuit layer 15, etc., on the C-surface 13b. The C-surface 13b corresponds to a reverse side (a surface) 11b of the workpiece 11.

As illustrated in FIG. 2A, a plurality of projected dicing lines, i.e., streets, 17 are established in a grid pattern on the face side 11a. The projected dicing lines 17 demarcate a plurality of rectangular areas on the face side 11a where respective devices 19 such as metal-oxide-semiconductor field-effect transistors (MOSFETs) or insulated gate bipolar transistors (IGBTs) are disposed. The devices 19 are not limited to any particular kinds, quantities, shapes, structures, sizes, layouts, etc. A predetermined key pattern, not illustrated, to be used in specifying the positions of the projected dicing lines 17 is disposed on the face side 11a. The thickness of the workpiece 11, i.e., the distance from the face side 11a to the reverse side 11b on the projected dicing lines 17, is in the range of 100 μm to 350 μm, for example. However, the thickness of the workpiece 11 is not limited to the specific range indicated.

Figure 2B:
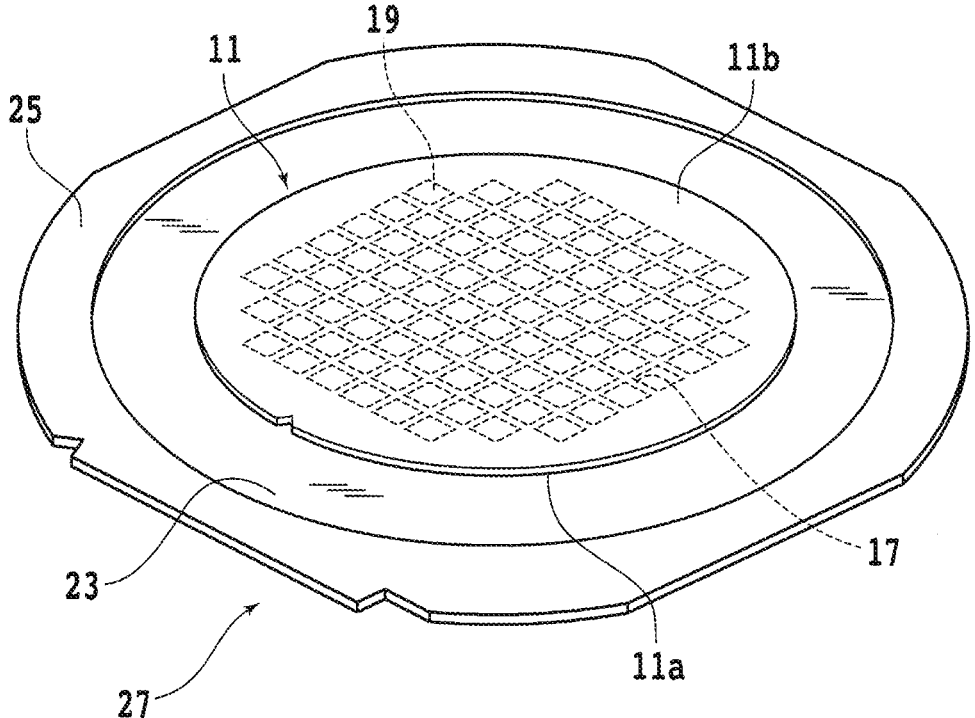
FIG. 2B is a perspective view of a workpiece unit.

As illustrated in FIG. 2B, when the workpiece 11 is processed, the workpiece 11 is handled in the form of a workpiece unit 27 where the workpiece 11 is integrally combined with an annular frame 25 of metal by a circular tape, i.e., a dicing tape, 23 made of a resin material or the like. FIG. 2B illustrates the workpiece unit 27 in perspective. The annular frame 25 has an inner circumferential edge that defines a circular opening that is larger in diameter than the workpiece 11.

In the workpiece unit 27 illustrated in FIG. 2B, the workpiece 11 is positioned in the circular opening of the annular frame 25 with the reverse side 11b exposed upwardly. The tape 23 is affixed to the face side 11a of the workpiece 11 and one surface, which faces downwardly in FIG. 2B, of the annular frame 25. The tape 23 has a diameter larger than that of the circular opening of the annular frame 25. The tape 23 is a film of resin including a base layer of resin and a glue layer, i.e., an adhesive layer, laminated on the base layer. The film is substantially transparent to and is transmissive of visible light and ultraviolet (UV) radiation.

The base layer is made of such a resin as polyolefin (PO), polyvinyl chloride (PVC), or polyethylene terephthalate (PET). The adhesive layer is made of an acryl-based resin, an epoxy-based resin, or the like that is UV-curable. The adhesive layer is disposed coextensively on one surface of the base layer. The UV-curable resin has relatively strong adhesive power before it is irradiated with UV rays. However, the adhesive power of the UV-curable resin is lowered once irradiated with UV rays. The tape 23 may be free of the adhesive layer at least in its area held in contact with the workpiece 11. In this case, the workpiece 11 is affixed to the tape 23 by way of thermocompression bonding, instead of adhesive bonding. After the workpiece unit 27 has been delivered to a cutting apparatus 2 (see FIG. 3), the workpiece 11 is cut along the projected dicing lines 17 by the cutting apparatus 2.

Figure 3:
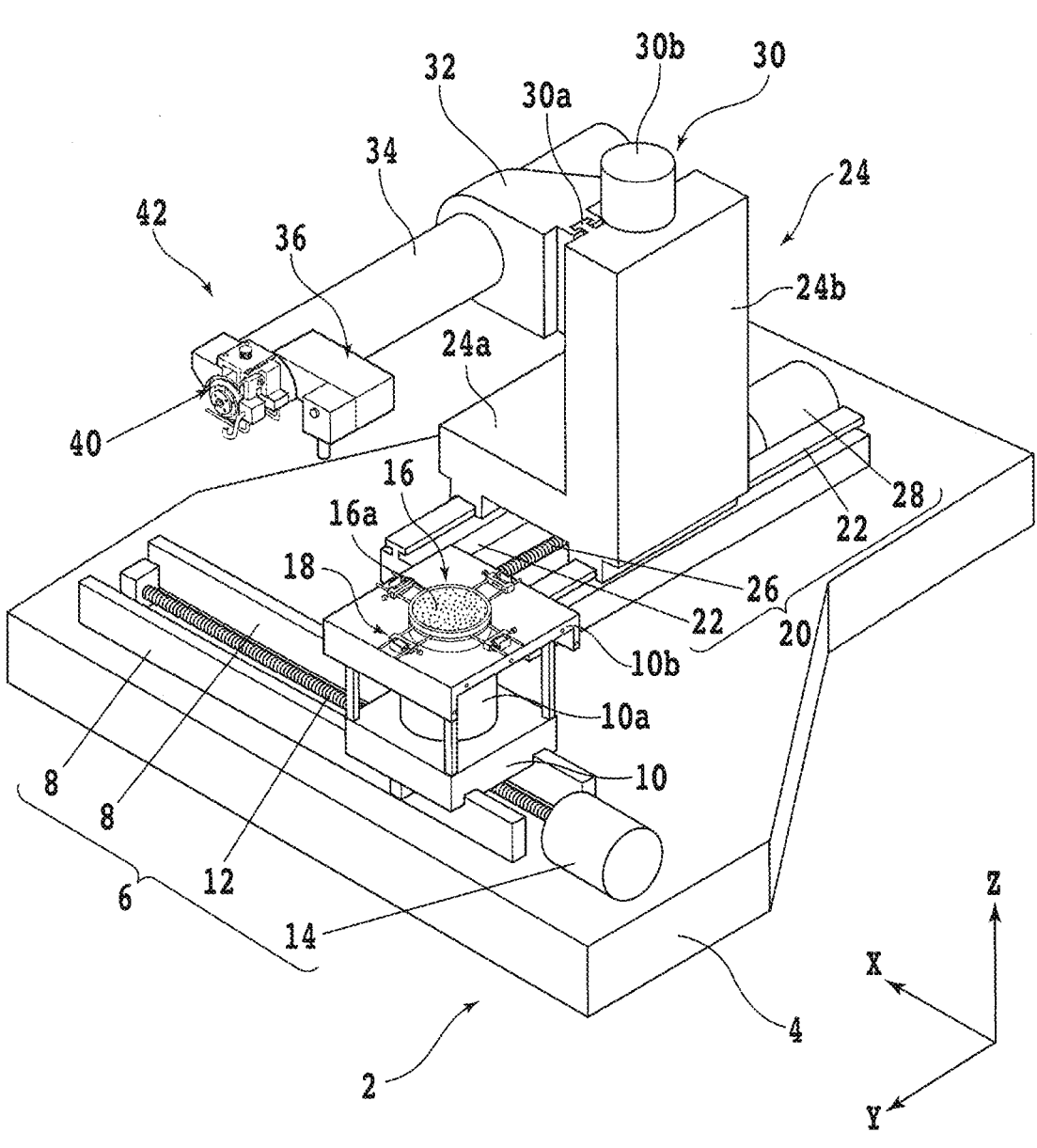
FIG. 3 is a perspective view of a cutting apparatus.

FIG. 3 illustrates the cutting apparatus 2 in perspective. In FIG. 3, the cutting apparatus 2 is illustrated in reference to a three-dimensional XYZ coordinate system having an X-axis extending in horizontal directions, i.e., processing feed directions, a Y-axis extending in horizontal directions, i.e., indexing feed directions, and a Z-axis extending in vertical or upward and downward directions, i.e., incising feed directions. The X-axis and the Y-axis extend perpendicularly to each other and extend perpendicularly to the Z-axis. The cutting apparatus 2 includes a base 4 supporting thereon various components of the cutting apparatus 2. The cutting apparatus 2 also includes a ball-screw-type X-axis moving unit 6 mounted on an upper surface of the base 4. The X-axis moving unit 6 has a pair of guide rails 8 extending substantially parallel to the X-axis.

A movable table 10 is slidably disposed on the guide rails 8 for sliding movement along the guide rails 8. A nut, not illustrated, that is fixedly disposed on a reverse side, i.e., a lower surface, of the movable table 10 is operatively threaded over a screw shaft 12 extending substantially parallel to the X-axis and lying between the guide rails 8. The screw shaft 12 has an end coupled to a drive source 14 such as a stepping motor. When the drive source 14 is energized, it rotates the screw shaft 12 about its central axis, causing the nut to move the movable table 10 along the X-axis along the guide rails 8. A cylindrical support post 10*a* is mounted substantially centrally on an upper surface of the movable table 10.

A rectangular table cover 10*b* is supported on the movable table 10 and lies above the support post 10*a*. A disk-shaped chuck table, i.e., a holding table, 16 is disposed on an upper surface of the table cover 10*b*. The support post 10*a* houses therein a drive source, not illustrated, such as an electric motor that is coupled to the chuck table 16. When the drive source is energized, it rotates the chuck table 16 about its central axis that extends substantially parallel to the Z-axis. The chuck table 16 has a disk-shaped frame made of a metal material such as stainless steel. The frame has a disk-shaped cavity defined in an upper portion thereof. The cavity is smaller in diameter than the frame.

A disk-shaped porous plate made of porous ceramic is fixedly disposed in the cavity in the frame. The porous plate is fluidly connected to a suction source, not illustrated, such as a vacuum pump through a predetermined fluid channel, not illustrated, defined in the frame. When the suction source is actuated, it generates and transmits a negative pressure through the fluid channel to the porous plate. The frame and the porous plate have respective upper surfaces that lie flush with each other, jointly making up a substantially flat holding surface 16*a* of the chuck table 16. The holding surface 16*a* lies substantially parallel to an XY plane defined along the X-axis and the Y-axis.

When the workpiece unit 27 is placed on the chuck table 16, the workpiece 11 is held under suction on the holding surface 16*a* with the tape 23 interposed therebetween by the negative pressure from the suction source that is applied to the porous plate. A plurality of, four in FIG. 3, clamp units 18 are disposed circumferentially around the chuck table 16 at substantially equal intervals. Each of the clamp units 18 clamps and secures in position the frame 25 of the workpiece unit 27 placed on the chuck table 16.

A ball-screw-type Y-axis moving unit 20 that is different from the X-axis moving unit 6 is mounted on the upper surface of the base 4. The Y-axis moving unit 20 has a pair of guide rails 22 extending substantially parallel to the Y-axis. A movable block 24 is slidably disposed on the guide rails 22 for sliding movement along the guide rails 22. The movable block 24 has a horizontal plate 24*a* on the guide rails 22. A nut, not illustrated, is fixedly disposed on a lower surface of the horizontal plate 24*a*.

The nut on the horizontal plate 24*a* is operatively threaded over a screw shaft 26 extending substantially parallel to the Y-axis and lying between the guide rails 22. The screw shaft 26 has an end coupled to a drive source 28 such as a stepping motor. When the drive source 28 is energized, it rotates the screw shaft 26 about its central axis, causing the nut to move the movable block 24 along the Y-axis along the guide rails 22. The movable block 24 also has a vertical plate 24*b* extending upwardly from the horizontal plate 24*a*. A Z-axis moving unit 30 is mounted on a side surface of the vertical plate 24*b* that extends substantially parallel to a YZ plane defined along the Y-axis and the Z-axis. The Z-axis moving unit 30 has a pair of guide rails 30*a*, one illustrated in FIG. 3, extending substantially parallel to the Z-axis.

A holder 32 is slidably disposed on the guide rails 30*a* for sliding movement along the guide rails 30*a*. A nut, not illustrated, that is fixedly disposed on a reverse side of the holder 32 is operatively threaded over a screw shaft, not illustrated, extending substantially parallel to the Z-axis and lying between the guide rails 30*a*. The screw shaft has an end coupled to a drive source 30*b* such as a stepping motor.

When the drive source 30*b* is energized, it rotates the screw shaft about its central axis, causing the nut to move the holder 32 along the Z-axis along the guide rails 30*a*. A hollow cylindrical spindle housing 34 that has a longitudinal axis extending substantially parallel to the Y-axis is fixedly supported by the holder 32.

An infrared camera 36 for capturing an image of the workpiece 11 on the chuck table 16 with infrared rays is mounted on a side of the spindle housing 34. The infrared camera 36 has one or more lenses, not illustrated, a light source, not illustrated, such as a light emitting diode (LED) for emitting infrared rays, and a solid-state image capturing device, i.e., a solid-state image sensor, not illustrated, for photoelectrically converting infrared rays into electric signals. The infrared camera 36 functions as a microscopic camera. A cylindrical spindle 38 (see FIG. 4) that has a longitudinal axis extending substantially parallel to the Y-axis has a portion rotatably supported in the spindle housing 34. The spindle 38 has a proximal end portion, not illustrated, where a drive source, not illustrated, such as an electric motor is provided.

Figure 4:
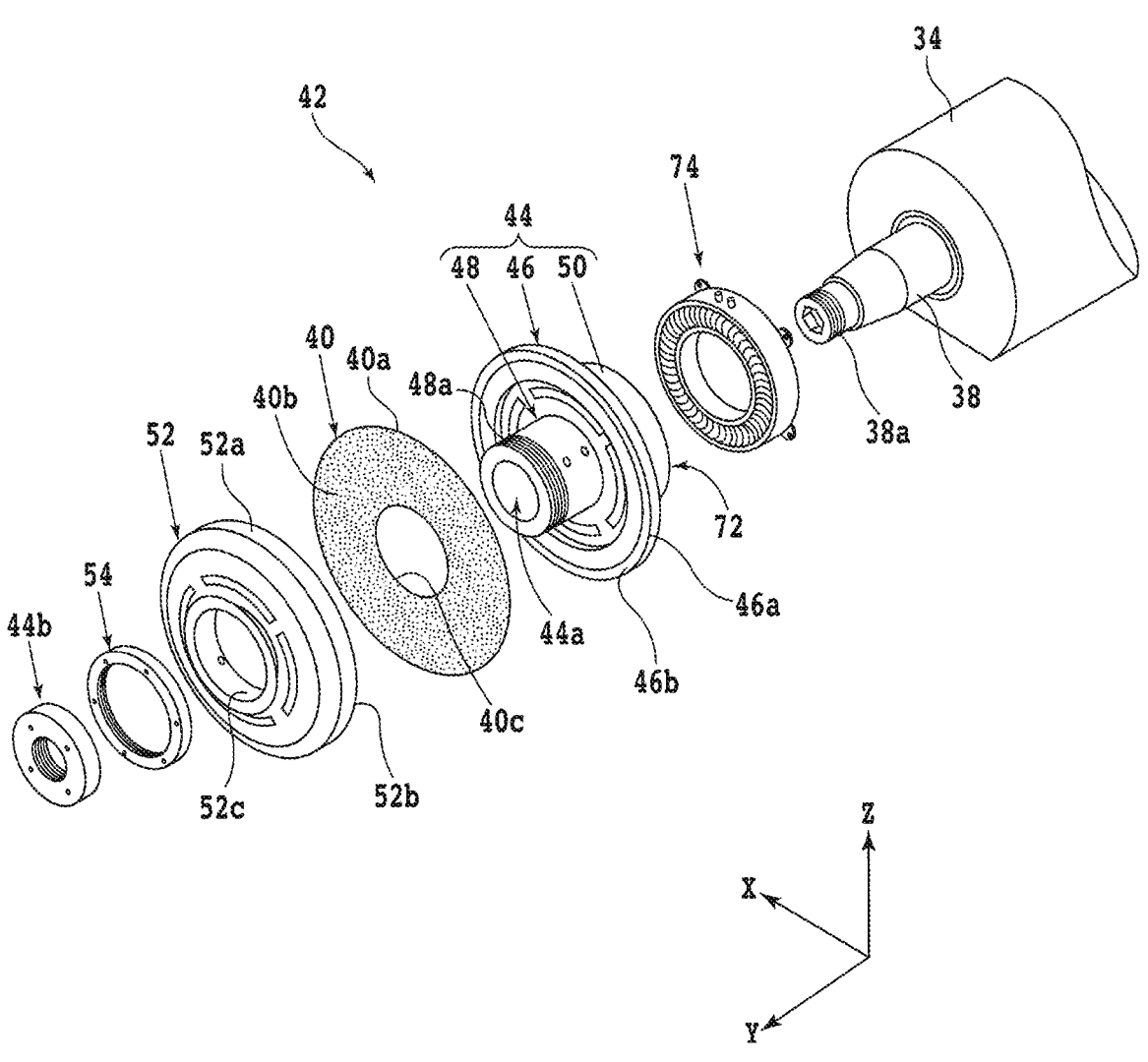
FIG. 4 is an exploded perspective view of a cutting unit.

The spindle 38 has a distal end portion projecting axially from the spindle housing 34. A first cutting blade 40 is mounted on the distal end portion of the spindle 38. According to the first embodiment, the first cutting blade 40 is a hubless, i.e., washer-type, blade having an annular cutting edge. As illustrated in FIG. 4, the first cutting blade 40 has a first surface 40*a* and a second surface 40*b* that are opposite each other and that lie substantially parallel to each other. The first cutting blade 40 has a circular through opening 40*c* defined diametrically centrally therein by an inner circumferential edge of the first cutting blade 40. The first cutting blade 40 is made of abrasive grains of diamond, cubic boron nitride (cBN), or the like that are bound together by a binder of metal, ceramic, resin, or the like.

Figure 5:
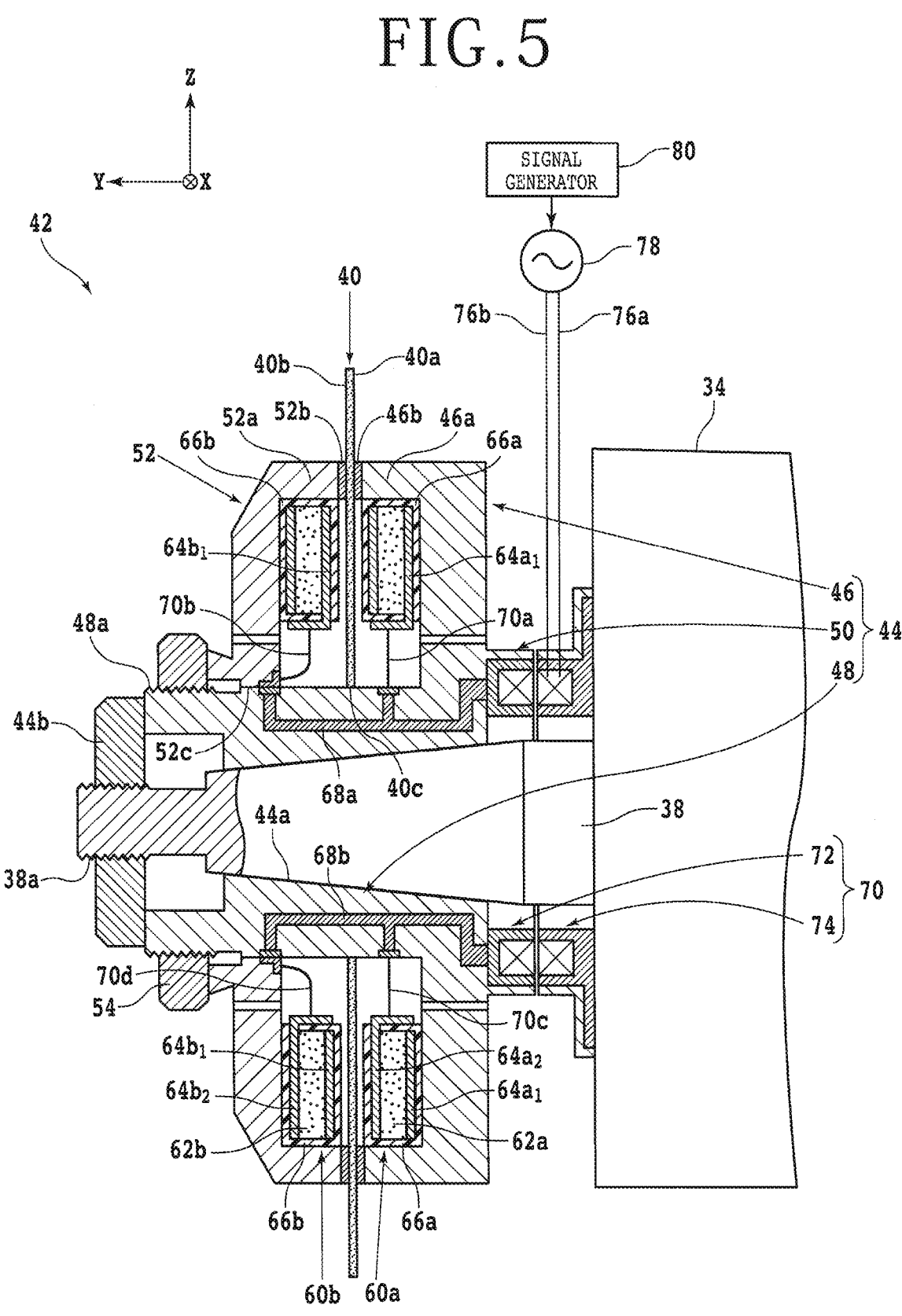
FIG. 5 is a side elevational view, partly in cross section, of the cutting unit.

FIG. 4 illustrates, in perspective, a cutting unit 42 including the first cutting blade 40. FIG. 5 illustrates the cutting unit 42 in side elevation and partly in cross section. As illustrated in FIG. 4, the distal end portion of the spindle 38 has external threads 38*a* on its outer circumferential surface. A disk-shaped mount 44 made mainly of metal has a central through hole 44*a* defined therein. The mount 44 is fixedly mounted on the spindle 38 as follows. When the mount 44 is fitted over the distal end portion of the spindle 38, the distal end portion of the spindle 38 is inserted in the central through hole 44*a*. At this time, the external threads 38*a* on the distal end portion of the spindle 38 protrude from the mount 44. Thereafter, an annular mounting nut 44*b* that is internally threaded is threaded over the external threads 38*a* on the distal end portion of the spindle 38. The annular mounting nut 44*b* is then tightened to fasten the mount 44 to the spindle 38.

The mount 44 has a disk-shaped flange 46 that has an annular ridge 46*a* positioned on an outer circumferential portion of the flange 46. The annular ridge 46*a* protrudes in a thicknesswise direction of the flange 46 that is perpendicular to the radial directions of the flange 46. As illustrated in FIG. 5, a resin layer 46*b* made of a synthetic resin is disposed on an annular surface of a distal end of the ridge 46*a*. The mount 44 also includes a first tubular boss 48 protruding in the thicknesswise direction of the flange 46 beyond the ridge 46*a*. The first tubular boss 48 is smaller in diameter than the flange 46. The first cutting blade 40 and other parts are disposed on an outer circumferential side surface of the first tubular boss 48.

The first tubular boss 48 has external threads 48*a* on the outer circumferential side surface of a distal end portion thereof. The mount 44 also includes a second tubular boss 50 protruding in an opposite thicknesswise direction of the flange 46. The second tubular boss 50 is smaller in diameter than the flange 46 but larger in diameter than the first tubular boss 48. The central through hole 44a in the mount 44 extends axially through the flange 46, the first tubular boss 48, and the second tubular boss 50 and includes a portion complementarily fitted over a frustoconical portion of the spindle 38 that is positioned closer to the proximal end portion thereof than the external threads 38a.

A disk-shaped presser flange 52 made mainly of metal is mounted on the first tubular boss 48. The presser flange 52 has an annular ridge 52a protruding in a thicknesswise direction of the presser flange 52 that is perpendicular to the radial directions of the presser flange 52. The annular ridge 52a is substantially equal in inside diameter and outside diameter to the annular ridge 46a of the flange 46. As illustrated in FIG. 5, a resin layer 52b made of a synthetic resin is disposed on an annular surface of a distal end of the annular ridge 52a. The presser flange 52 has a radially central opening 52c that extends axially therethrough and that is defined diametrically centrally therein by an inner circumferential edge of the presser flange 52.

The first cutting blade 40 is assembled on the mount 44 as follows. The mount 44 has already been fastened to the spindle 38 by the annular mounting nut 44b, as described above. The inner circumferential edge of the first cutting blade 40 that defines the circular through opening 40c in the first cutting blade 40 and the inner circumferential edge of the presser flange 52 that defines radially central opening 52c in the presser flange 52 are fitted over the first tubular boss 48 such that the first cutting blade 40 is sandwiched between the resin layer 46b on the ridge 46a of the flange 46 of the mount 44 and the resin layer 52b on the annular ridge 52a of the presser flange 52. With the first cutting blade 40 and the presser flange 52 being disposed on the outer circumferential side surface of the first tubular boss 48, an annular mounting nut 54 that is internally threaded is threaded over the external threads 48a on the distal end portion of the first tubular boss 48. The first cutting blade 40 as sandwiched between the flange 46 and the presser flange 52 is now fixedly mounted on the distal end portion of the spindle 38.

The first cutting blade 40 can be vibrated at a frequency in the ultrasonic band in the range of 20 kHz to 500 kHz, for example. In order to make the first cutting blade 40 thus vibratable, an annular ultrasonic vibrator 60a is disposed radially inwardly of the annular ridge 46a of the flange 46 of the mount 44. According to the present embodiment, the annular ultrasonic vibrator 60a is of the electrostrictive type and has an annular piezoelectric body 62a.

The annular piezoelectric body 62a is made of piezoelectric ceramic such as barium titanate or lead zirconate titanate, for example. The annular piezoelectric body 62a has a pair of opposite annular side surfaces on which a pair of electrodes $64a_1$ and $64a_2$ are disposed in sandwiching relation to the annular piezoelectric body 62a. An insulating film 66a is disposed between the electrodes $64a_1$ and $64a_2$ and also between the electrodes $64a_1$ and $64a_2$ and the flange 46 to prevent the electrodes $64a_1$ and $64a_2$ from electrically contacting each other and also to prevent the electrodes $64a_1$ and $64a_2$ and the flange 46 from electrically contacting each other.

Another annular ultrasonic vibrator 60b is disposed radially inwardly of the annular ridge 52a of the presser flange 52. The annular ultrasonic vibrator 60b similarly includes an annular piezoelectric body 62b, a pair of electrodes 64b1 and $64b_2$, and an insulating film 66b. A pair of electric interconnects 68a and 68b are embedded in the first tubular boss 48 of the mount 44. Each of the electric interconnects 68a and 68b has a pair of bifurcated end portions extending radially outwardly to the outer circumferential side surface of the first tubular boss 48.

One of the bifurcated end portions of the electric interconnect 68a in the mount 44 is electrically connected through a lead 70a to the electrode $64a_1$ of the ultrasonic vibrator 60a, whereas the other bifurcated end portion of the electric interconnect 68a in the mount 44 is electrically connected through a lead 70b to the electrode 64b1 of the ultrasonic vibrator 60b. Similarly, one of the bifurcated end portions of the electric interconnect 68b in the mount 44 is electrically connected through a lead 70c to the electrode $64a_2$ of the ultrasonic vibrator 60a, whereas the other bifurcated end portion of the electric interconnect 68b in the mount 44 is electrically connected through a lead 70d to the electrode $64b_2$ of the ultrasonic vibrator 60b.

The electric interconnects 68a and 68b in the mount 44 are supplied with electric power from an alternating current (AC) power supply 78 such as a high-speed bipolar power supply through a rotary transformer 70. The rotary transformer 70 includes a power receiving unit 72 disposed in the second tubular boss 50 of the mount 44 and a power supplying unit 74 disposed in a distal end portion of the spindle housing 34. The power receiving unit 72 includes an annular core and a coil wound around the annular core. The coil has an end electrically connected to the electric interconnect 68a and the other end electrically connected to the electric interconnect 68b.

Likewise, the power supplying unit 74 also includes an annular core and a coil wound around the annular core. The coil of the power supplying unit 74 has opposite ends electrically connected through respective leads 76a and 76b to the AC power supply 78. The AC power supply 78 is electrically connected to a signal generator 80 that controls the frequency of an AC voltage to be supplied from the AC power supply 78 to the rotary transformer 70.

When the AC power supply 78 supplies electric power through the rotary transformer 70 to the electrodes $64a_1$ and $64a_2$, the annular piezoelectric body 62a vibrates, i.e., contracts and expands, in the radial directions of the mount 44 and the presser flange 52. Similarly, when the AC power supply 78 supplies electric power through the rotary transformer 70 to the electrodes $64b_1$ and $64b_2$, the annular piezoelectric body 62b vibrates, i.e., contracts and expands, in the radial directions of the mount 44 and the presser flange 52.

In FIG. 5, clearances are illustrated as being present between the ultrasonic vibrators 60a and 60b and the first cutting blade 40. Actually, however, the ultrasonic vibrators 60a and 60b and the first cutting blade 40 are held against each other with some members, not illustrated, interposed therebetween. When the piezoelectric bodies 62a and 62b vibrate, the mount 44, the presser flange 52, and the first cutting blade 40 are vibrated together. According to the present embodiment, the piezoelectric bodies 62a and 62b vibrate in the radial directions of the first cutting blade 40, instead of in the thicknesswise directions of the first cutting blade 40. The first cutting blade 40 is vibrated to an amplitude of 5.0 μm, for example.

The cutting apparatus 2 includes a controller or a control unit, not illustrated, for controlling operations of the X-axis moving unit 6, the chuck table 16, the Y-axis moving unit 20, the Z-axis moving unit 30, the cutting unit 42, the infrared camera 36, the AC power supply 78, the signal generator 80, etc. The controller is a computer including a processor, i.e., a processing device, such as a central processing unit (CPU), and a memory, i.e., a storage device.

The memory includes a main storage device such as a dynamic random access memory (DRAM), a static random access memory (SRAM), or a read only memory (ROM), and an auxiliary storage device such as a flash memory, a hard disk drive, or a solid state drive. The auxiliary storage device stores software including predetermined programs. The controller has its functions performed by operating the processor, etc., according to the programs.

Figure 6:
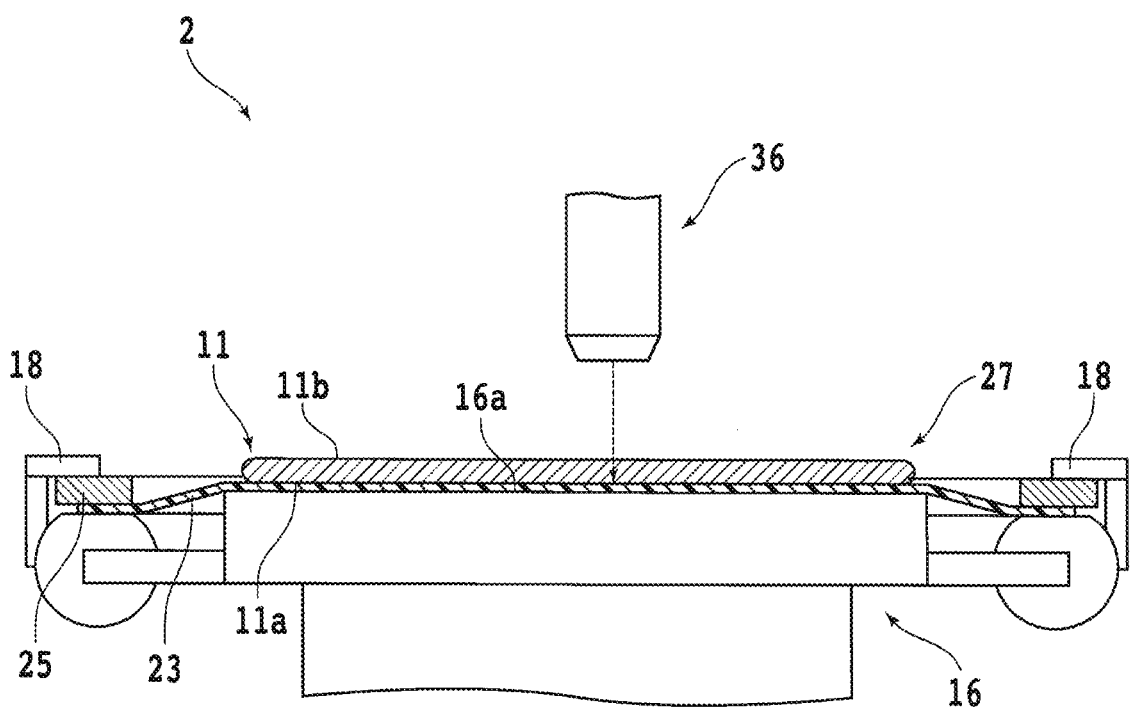
FIG. 6 is a side elevational view, partly in cross section, illustrating a cutting position detecting step of the method according to the first embodiment.

The steps illustrated in FIG. 1 will be described below with reference to FIGS. 6 through 10B. First, as illustrated in FIG. 6, the workpiece unit 27 is placed on the chuck table 16. Then, the workpiece 11 is held under suction on the holding surface 16a with the tape 23 interposed therebetween, and the frame 25 is clamped and secured in position by the clamp units 18. At this time, the reverse side 11b of the workpiece 11 is exposed upwardly. Then, the infrared camera 36 captures an infrared image of the face side 11a of the workpiece 11 with infrared rays transmitted through the workpiece 11 from the reverse side 11b, thereby acquiring the image of the face side 11a.

The key pattern on the face side 11a is spaced from the projected dicing lines 17 by predetermined distances. Then, the controller detects the position, on the XY plane, of at least one of the projected dicing lines 17 on the basis of the coordinates of the key pattern that is included in the image of the face side 11a and the distances by which the key pattern is spaced from the projected dicing lines 17 (cutting position detecting step).

FIG. 6 illustrates, in side elevation and partly in cross section, the position detecting step of the method according to the first embodiment. After the cutting position detecting step, the chuck table 16 is turned about its central axis to make the one of the projected dicing lines 17 substantially parallel to the X-axis, thereby adjusting the orientation of the workpiece 11. While the workpiece 11 is being held under suction on the holding surface 16a, the first cutting blade 40 cuts the workpiece 11 along the projected dicing line 17, forming a cut groove 11c (see FIG. 8B) that terminates short of the face side 11a, in the workpiece 11 along the projected dicing line 17 (cut groove forming step S10).

Figure 7:
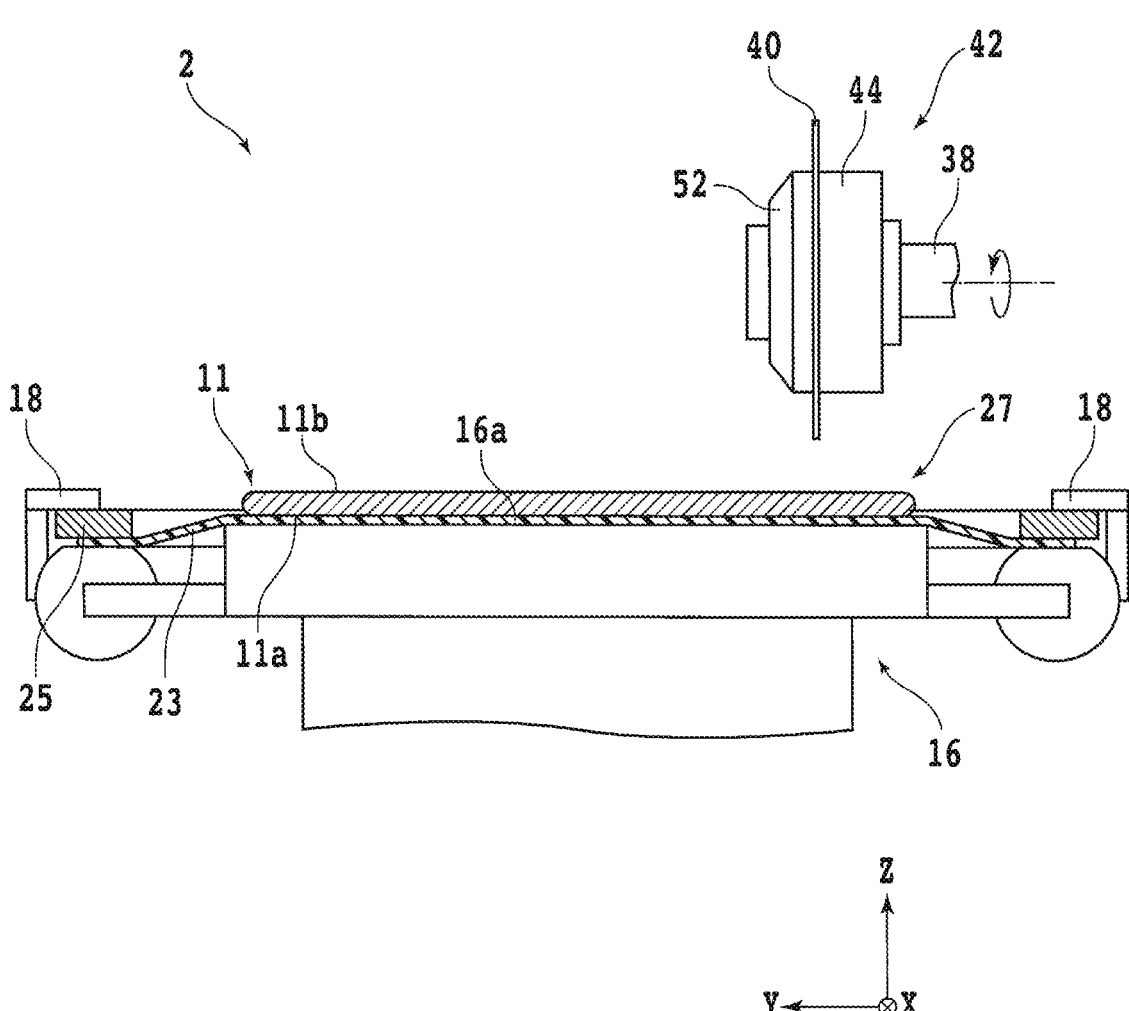
FIG. 7 is a side elevational view, partly in cross section, illustrating a cut groove forming step of the method according to the first embodiment.

FIG. 7 illustrates, in side elevation and partly in cross section, the cut groove forming step S10 of the method according to the first embodiment. In the cut groove forming step S10, the spindle 38 is rotated at a predetermined speed, and the first cutting blade 40 is vibrated at the frequency in the ultrasonic band. The first cutting blade 40 as it is rotating and vibrating is vertically moved to have its lower end placed in a vertical position between the reverse side 11b and the face side 11a of the workpiece 11. While the first cutting blade 40 is being supplied with cutting water such as pure water, the first cutting blade 40 is placed on an extension of the projected dicing line 17. Then, the chuck table 16 is moved along the X-axis to cause the first cutting blade 40 to cut the workpiece 11 along the projected dicing line 17.

FIG. 8A also illustrates the cut groove forming step S10 in enlarged fragmentary side elevation and partly in cross section. As illustrated in FIG. 8A, the first cutting blade 40 has an edge thickness 40d. When the first cutting blade 40 cuts the workpiece 11 along the projected dicing line 17, it forms a cut groove 11c (see FIG. 8B) in the workpiece 11 along the projected dicing line 17. The cut groove 11c has a width 11d that is essentially the same as the edge thickness 40d of the first cutting blade 40, that is, the thickness of the first cutting blade 40 between the first surface 40a and the second surface 40b thereof. According to the first embodiment, the abrasive grains of the first cutting blade 40 have an average particle diameter of 3.0 μm, and the edge thickness 40d is 30 μm.

If the size of a particle is represented by a certain particle diameter, i.e., length, then the average particle diameter referred to above is specified on the basis of a frequency distribution of particle diameters of a particle group. A particle diameter is represented by any of various known diameters including geographic diameters, equivalent diameters, etc. The geographic diameters include a Feret diameter, a directed maximum diameter, i.e., a Krummbein diameter, a Martin diameter, a sieve diameter, etc., whereas the equivalent diameters include a projected area circle equivalent diameter, i.e., a Heywood diameter, an isosurface area sphere equivalent diameter, an isovolumetric sphere equivalent diameter, a Stokes' diameter, a light scattering diameter, etc. When a frequency distribution of particle diameters of a particle group is plotted as a graph having a horizontal axis representing particle diameters (μ) and a vertical axis representing frequencies, the average diameter of a weight-based distribution or a volume-based distribution represents an average particle diameter, for example.

Figure 8B:
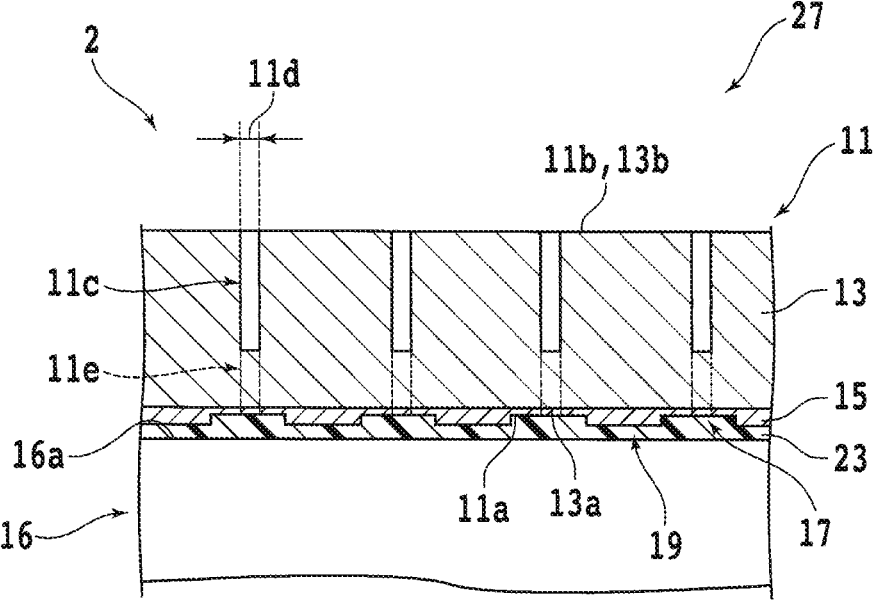
FIG. 8B is an enlarged fragmentary side elevational view, partly in cross section, illustrating the workpiece unit that has undergone the cut groove forming step.

The portion of the workpiece 11 that is left between the bottom of the cut groove 11c and the face side 11a is referred to as an uncut residual portion 11e (see FIG. 8B). The uncut residual portion 11e should preferably have a thickness in the range of 20 μm to 50 μm. If the thickness of the uncut residual portion 11e exceeds 50 μm, then it may tend to load a second cutting blade 84 to be described later, lowering the quality of the reverse side 11b and the side surfaces of the cut groove 11c that are to be cut by the second cutting blade 84. If the thickness of the uncut residual portion 11e is less than 20 μm, then the workpiece 11 may crack from the cut groove 11c in the subsequent workpiece overturning step S20. If the workpiece 11 cracks, device chips 33 to be fabricated from the workpiece 11 may positionally be shifted in the subsequent dividing step S30, lowering the quality of the device chips 33.

After the cut groove 11c has been formed in the workpiece 11 along the projected dicing line 17 from one end to the other, the cutting unit 42 is indexing-fed along the Y-axis to bring the first cutting blade 40 into alignment with another projected dicing line 17 adjacent to the projected dicing line 17 along which the cut groove 11c has been formed. Then, the first cutting blade 40 forms a cut groove 11c in the workpiece 11 along the other projected dicing line 17. After cut grooves 11c have been formed in the workpiece 11 along all the projected dicing lines 17 that extend along a direction, the chuck table 16 is turned approximately 90 degrees about its central axis. Then, cut grooves 11c are formed in the workpiece 11 along all the projected dicing lines 17 that extend along another direction that extends perpendicularly to the direction described above. When the cut grooves 11c have been formed in the workpiece 11 along all the projected dicing lines 17 on the workpiece 11, the uncut residual portions 11e are left in the workpiece 11 along all the projected dicing lines 17. An example of processing conditions in the cut groove forming step S10, i.e., first processing conditions, is illustrated below.

Spindle rotational speed: 30000 rpm
    Processing feed speed: 20 mm/s
    Cutting mode: Downward cutting
    Cutting water flow rate: 1.0 L/min
    First cutting blade amplitude: 5.0 μm
    FIG. 8B illustrates the workpiece unit 27 that has undergone the cut groove forming step S10, in enlarged fragmentary side elevation and partly in cross section. After the cut groove forming step S10, the workpiece 11 is overturned (Workpiece overturning step S20).

Figure 9:
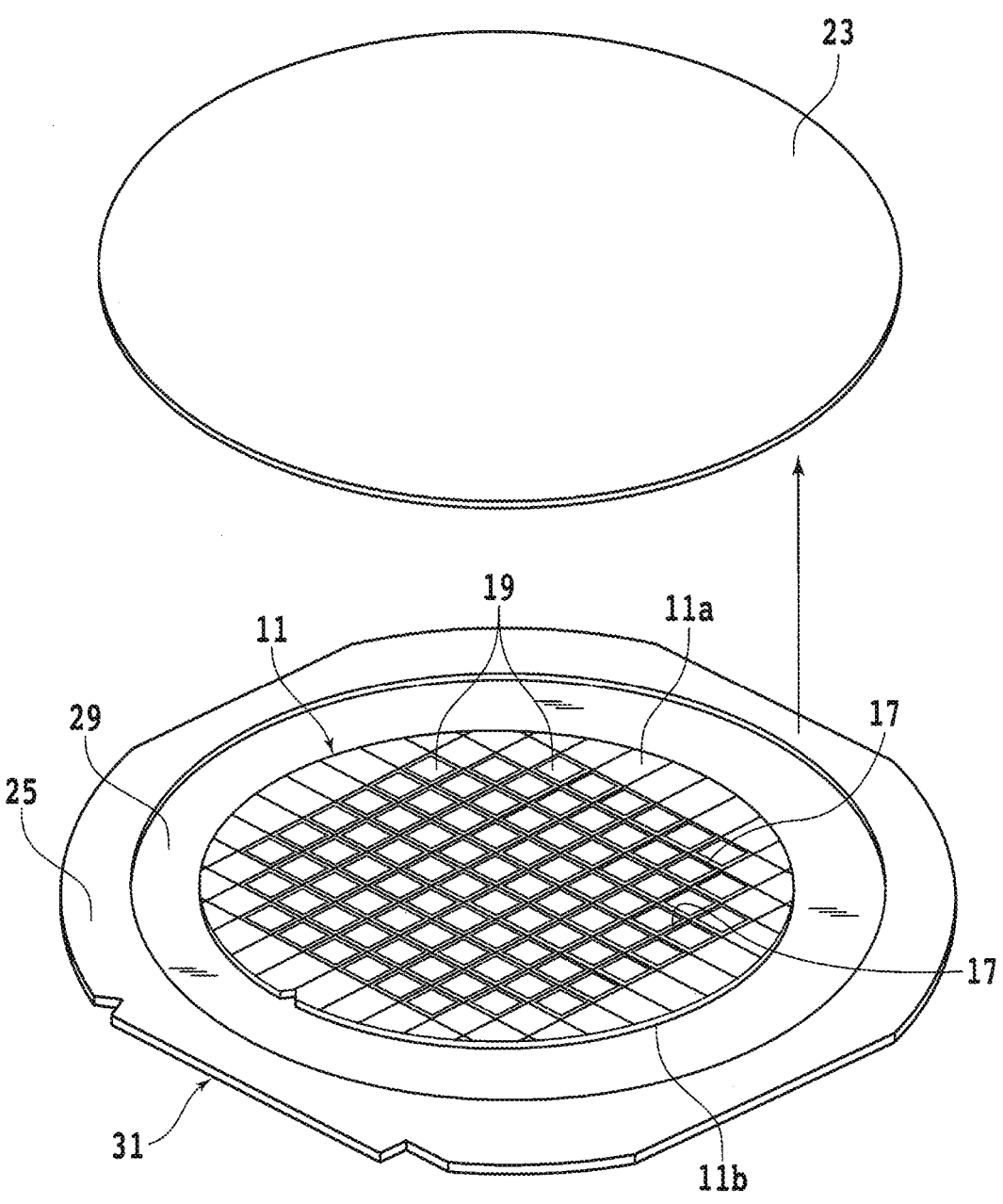
FIG. 9 is a perspective view illustrating a workpiece overturning step of the method according to the first embodiment.

FIG. 9 illustrates the workpiece overturning step S20 in perspective. As illustrated in FIG. 9, in the workpiece overturning step S20, a tape, i.e., a dicing tape, 29 is affixed to the reverse side 11b of the workpiece 11, and then, UV rays are applied to the face side 11a of the workpiece 11 to reduce the bonding strength between the tape 23 and the workpiece 11. Thereafter, the tape 23 is peeled off from the workpiece 11. The tape 29 is a film of resin including a base layer of resin and a glue layer, i.e., an adhesive layer, laminated on the base layer, for example. The film is substantially transparent and is transmissive of visible light. When the tape 29 has been affixed and the tape 23 has been peeled off, the resultant assembly including the workpiece 11 integrally combined with the annular frame 25 by the tape 29 makes up a workpiece unit 31 where the face side 11a of the workpiece 11 is exposed.

If the workpiece 11 is affixed to the tape 23 by way of thermocompression bonding instead of adhesive bonding, then the tape 23 can be peeled off from the workpiece 11 in the manner of a 180-degree peeling test. Specifically, an end of the tape 23 is gripped, and the tape 23 is folded back on itself through approximately 180 degrees, after which the gripped end is moved relatively to the workpiece 11 along the direction in which the tape 23 has been folded back. If the tape 23 is cooled, the tape 23 shrinks and can easily be peeled off. The tape 23 that is affixed to the workpiece 11 by way of thermocompression bonding instead of adhesive bonding is advantageous in that no adhesive is left on the workpiece 11 after the tape 23 has been peeled off.

After the workpiece overturning step S20, a cutting apparatus 2a (see FIG. 10A) is used to cut the workpiece 11 to divide it into a plurality of device chips 33 (dividing step S30). The cutting apparatus 2a is essentially the same as the cutting apparatus 2 described above, except as follows. The cutting apparatus 2a includes a visible light camera, not illustrated, instead of the infrared camera 36. The visible light camera has one or more lenses, not illustrated, a light source, not illustrated, such as an LED for emitting visible light, and a solid-state image capturing device, i.e., an image sensor, for photoelectrically converting visible light into electric signals. The cutting apparatus 2a has a cutting unit 42 that is free of the ultrasonic vibrators 60a and 60b that produce vibrations in the ultrasonic band. Further, the cutting unit 42 of the cutting apparatus 2a has a spindle 38 on which the second cutting blade 84 different from the first cutting blade 40 is mounted.

Figure 10A:
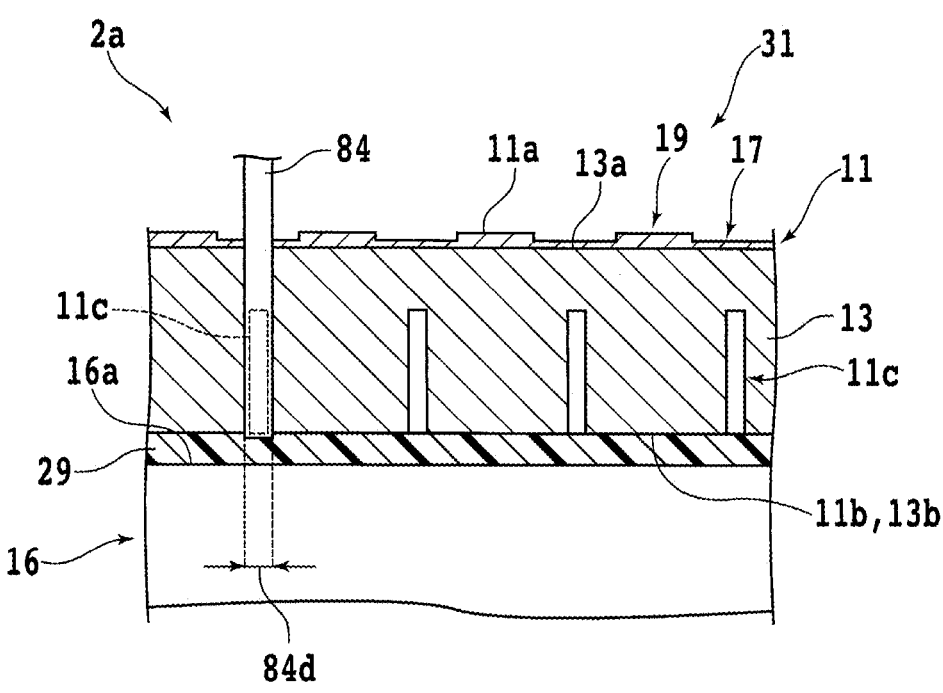
FIG. 10A is an enlarged fragmentary side elevational view, partly in cross section, illustrating a dividing step of the method according to the first embodiment.

As illustrated in FIG. 10A, the second cutting blade 84 has an edge thickness 84d larger than the edge thickness 40d of the first cutting blade 40. For example, the edge thickness 84d of the second cutting blade 84 is 35 μm. The average particle diameter of the abrasive grains of the second cutting blade 84 is smaller than the average particle diameter of the abrasive grains of the first cutting blade 40. For example, the average particle diameter of the abrasive grains of the second cutting blade 84 is 1.0 μm.

Although the cutting apparatus 2a is different from the cutting apparatus 2 as regards the visible light camera, the second cutting blade 84, etc., the other structural details of the cutting apparatus 2a are essentially identical to those of the cutting apparatus 2. Therefore, in the description of the cutting apparatus 2a, those components of the cutting apparatus 2a that are identical to those of the cutting apparatus 2 are denoted by identical reference characters. In the dividing step S30, while the workpiece unit 31 is being held under suction on the chuck table 16 with the face side 11a facing upwardly, the visible light camera captures an image of the face side 11a of the workpiece 11, and the position, on the XY plane, of at least one of the projected dicing lines 17 is detected on the basis of the captured image (cutting position detecting step).

After the cutting position detecting step, one of the projected dicing lines 17 is made substantially parallel to the X-axis, thereby adjusting the orientation of the workpiece 11. While the workpiece 11 is being held under suction on the holding surface 16a with the tape 29 interposed therebetween, the second cutting blade 84 cuts the workpiece 11 to divide it into a plurality of device chips 33 (dividing step S30).

FIG. 10A illustrates the dividing step S30 in enlarged fragmentary side elevation and partly in cross section. In the dividing step S30, the second cutting blade 84 is not vibrated at a frequency in the ultrasonic band, but the second cutting blade 84 as it is rotating is vertically moved to have its lower end placed in a vertical position between the holding surface 16a and the reverse side 11b of the workpiece 11. While the second cutting blade 84 is being supplied with cutting water such as pure water, the second cutting blade 84 is placed on an extension of the projected dicing line 17. Then, the chuck table 16 is moved along the X-axis to cause the second cutting blade 84 to cut the workpiece 11 along the projected dicing line 17, removing the uncut residual portion 11e from the workpiece 11 and fully severing the workpiece 11.

When the second cutting blade 84 is positioned in alignment with the projected dicing line 17, the second cutting blade 84 has its center in its widthwise directions aligned with the center of the projected dicing line 17 in its widthwise directions. Since the edge thickness 84d is larger than the edge thickness 40d, the second cutting blade 84 cuts off both side surfaces of the cut groove 11c as well as the uncut residual portion 11e in the dividing step S30.

After the second cutting blade 84 has cut the workpiece 11 along the projected dicing line 17 from one end to the other, the cutting unit 42 including the second cutting blade 84 is indexing-fed along the Y-axis to bring the second cutting blade 84 into alignment with another projected dicing line 17 adjacent to the projected dicing line 17 along which the second cutting blade 84 has previously cut the workpiece 11. Then, the second cutting blade 84 cuts the workpiece 11 along the other projected dicing line 17. After the second cutting blade 84 has cut the workpiece 11 along all the projected dicing lines 17 that extend along a direction, the chuck table 16 is turned approximately 90 degrees about its central axis. Then, the second cutting blade 84 cuts the workpiece 11 along all the projected dicing lines 17 that extend along another direction that extends perpendicularly to the direction described above. In this fashion, the second cutting blade 84 cuts the workpiece 11 to divide it into a plurality of device chips 33.

Figure 10B:
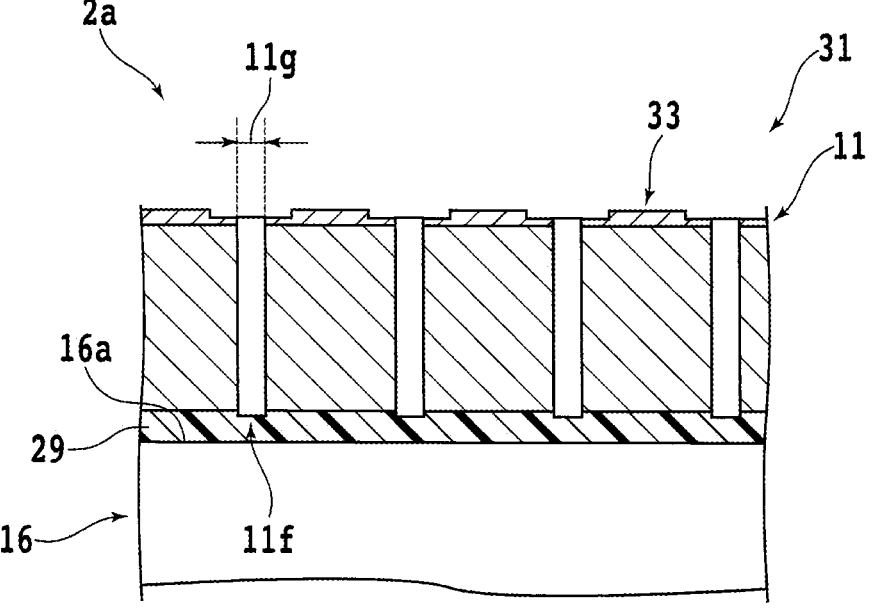
FIG. 10B is an enlarged fragmentary side elevational view, partly in cross section, illustrating the workpiece unit that has undergone the dividing step.

FIG. 10B illustrates the workpiece unit 31 that has undergone the dividing step S30 in enlarged fragmentary side elevation and partly in cross section. In the dividing step S30, the second cutting blade 84 forms dividing grooves 11f in the workpiece 11 along the respective projected dicing lines 17. Each of the dividing grooves 11f has a width 11g that is substantially the same as the edge thickness 84d of the second cutting blade 84. The dividing grooves 11f extend all the way through the workpiece 11 to the tape 29 on the reverse side 11b. An example of processing conditions in the dividing step S30, i.e., second processing conditions, is illustrated below.

Spindle rotational speed: 55000 rpm

Processing feed speed: 10 mm/s

Cutting mode: Downward cutting

Cutting water flow rate: 1.0 L/min

According to the present embodiment, in the cut groove forming step S10, the first cutting blade 40 as it vibrates at the frequency in the ultrasonic band cuts the workpiece 11 along the projected dicing lines 17. Hence, the first cutting blade 40 can cut the workpiece 11 that includes the SiC substrate 13, even though the first cutting blade 40 has abrasive grains having a relatively small average particle diameter. In the dividing step S30, the second cutting blade 84 cuts off the uncut residual portions 11e, dividing the workpiece 11 into a plurality of device chips 33. The uncut residual portions 11e contain cracks developed due to vibrations produced at the frequency in the ultrasonic band, and hence resistance to the second cutting blade 84 is reduced. Consequently, even though the second cutting blade 84 has abrasive grains having a relatively small average particle diameter, it can cut the workpiece 11 that includes the SiC substrate 13.

The first cutting blade 40 and the second cutting blade 84, each having abrasive grains having a relatively small average particle diameter, are effective to divide the workpiece 11 that includes the SiC substrate 13 into a plurality of device chips 33. The first cutting blade 40 and the second cutting blade 84 are able to reduce the number and size of chippings near the face and reverse sides 11a and 11b of the workpiece 11, compared with a situation where the workpiece 11 is cut fully thereacross all the way and a situation where the cutting blade is not vibrated at a frequency in the ultrasonic band when the cutting blade forms half-cut grooves in the workpiece.

According to the present embodiment, the reverse side 11b, i.e., the C-surface 13b, of the workpiece 11 is not cut by the first cutting blade 40 cutting into the workpiece 11 through the face side 11a, i.e., the Si-surface 13a, but the reverse side 11b, facing upwardly, of the workpiece 11 is cut by the first cutting blade 40 that cuts into the workpiece 11 through the reverse side 11b toward the face side 11a facing downwardly. The applicant has found that, when the SiC substrate 13 is cut, chippings are likely to occur at the C-surface 13b. The method of manufacturing device chips 33 according to the first embodiment is effective to reduce chippings occurring at the C-surface 13b, compared with a situation where the face side 11a, facing upwardly, of the workpiece 11 is cut by the first cutting blade 40 that cuts into the workpiece 11 through the face side 11a toward the reverse side 11b facing downwardly. According to the present embodiment, the relatively small average particle diameter referred to above is 6.0 μm or less. A cutting blade made of abrasive grains having an average particle diameter in excess of 6.0 μm is not preferable because, if it is used to cut the workpiece 11, the number and size of chippings that occur at the face side 11a and/or the reverse side 11b are liable to increase.

In addition, according to the present embodiment, end faces that are cut by the second cutting blade 84 having the abrasive grains whose average particle diameter is smaller than the average particle diameter of the abrasive grains of the first cutting blade 40 serve as outer peripheral side surfaces, i.e., four side surfaces, of the device chips 33. Accordingly, since surface irregularities of the side surfaces of the device chips 33 that are cut by the second cutting blade 84 are reduced compared with surface irregularities of the side surfaces of the device chips 33 that are cut by the first cutting blade 40, the device chips 33 have increased mechanical strengths and better appearances. However, the present embodiment is not limited to the processing feed speed, the spindle rotational speed, the cutting water flow rate, and the average particle diameters of the abrasive grains of the first cutting blade 40 and the second cutting blade 84 as described above. These parameters may be adjusted depending on the cutting quality, the cutting time, etc.

Experimental results will be described below with reference to FIGS. 11A through 13B. FIGS. 11A through 11F illustrate, in enlarged plan, an Si-surface 13a of a first SiC substrate 13-1 that has been divided by the method according to the first embodiment (Experiment A). No devices 19 were present on the first SiC substrate 13-1 cut in Experiment A. In Experiment A, the first SiC substrate 13-1 had a diameter of 4 inches, i.e., approximately 100 mm, and a thickness of 100 μm, and the uncut residual portion 11e left in the cut groove forming step S10 had a thickness of 25 μm.

The cut groove forming step S10, the workpiece overturning step S20, and the dividing step S30 were carried out to form 96 dividing grooves, i.e., cut grooves, 11f along a first direction $A_1$ and 96 dividing grooves 11f along a second direction $A_2$ perpendicular to the first direction $A_1$. Indexed distances in the first direction $A_1$ and the second direction $A_2$ across the dividing grooves 11f were 1.0 mm. The first direction $A_1$ is substantially perpendicular to the lengthwise directions of the orientation flat of the first SiC substrate 13-1, and the second direction $A_2$ is substantially parallel to the lengthwise directions of the orientation flat. The other processing conditions were the same as those of the first embodiment.

Figures 11A, 11B, 11C, 11D, 11E, 11F:
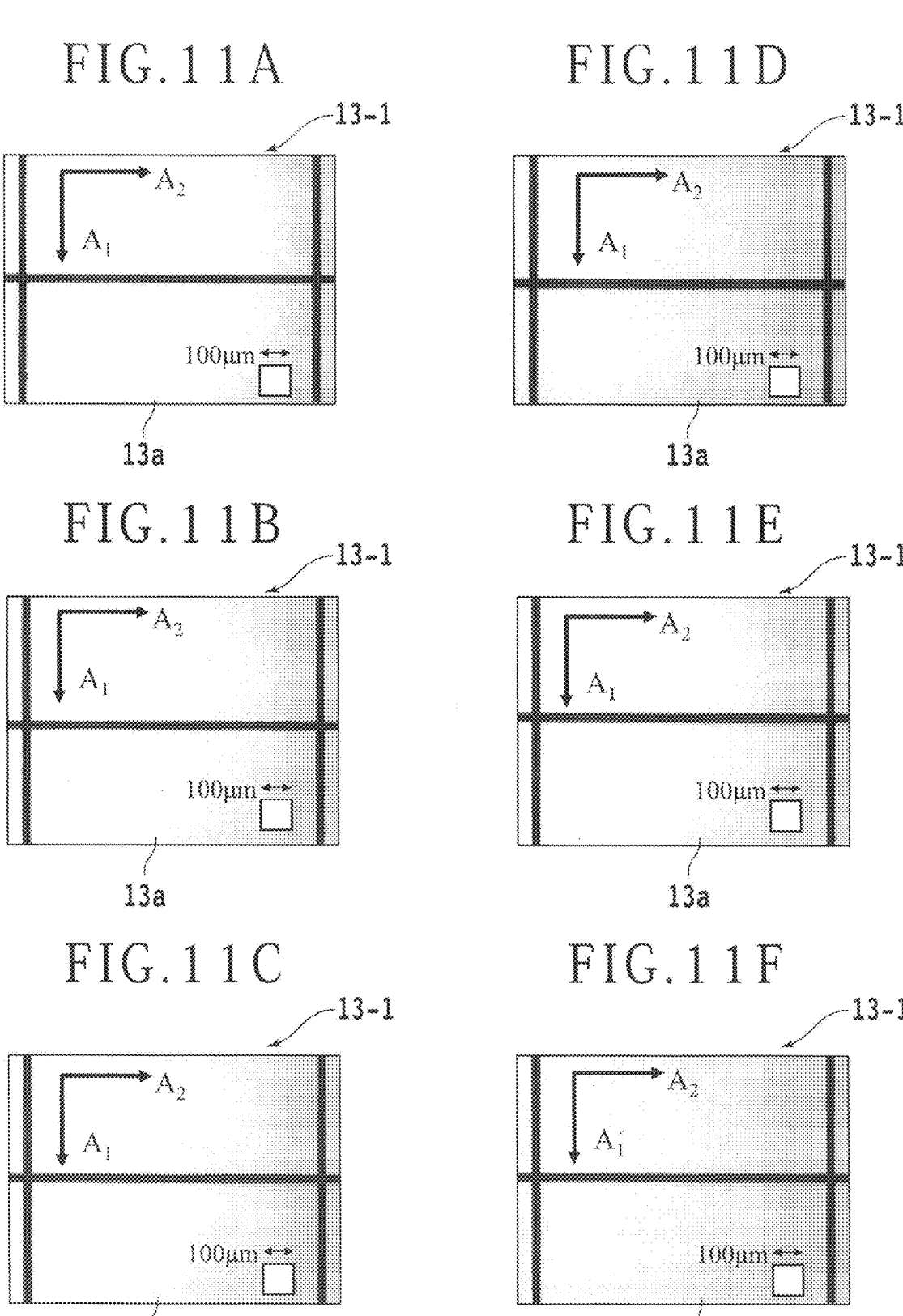
FIGS. 11A through 11F are enlarged plan views of an Si surface of an SiC substrate that has been divided by the method according to the first embodiment.

FIGS. 11A through 11F illustrates areas near the intersections of the dividing grooves 11f in the Si-surface 13a of the first SiC substrate 13-1. The intersections illustrated in FIGS. 11A through 11F are located at different positions on the first SiC substrate 13-1. FIG. 11A illustrates the 20th dividing groove 11f among those dividing grooves 11f that extend laterally, i.e., horizontally, in FIG. 11A. Similarly, FIG. 11B illustrates the 30th dividing groove 11f, FIG. 11C illustrates the 40th dividing groove 11f, FIG. 11D illustrates the 50th dividing groove 11f, FIG. 11E illustrates the 60th dividing groove 11f, and FIG. 11F illustrates the 70th dividing groove 11f.

FIGS. 12A through 12F illustrate, in enlarged plan, an Si-surface 13a of a second SiC substrate 13-2 that has been divided by a method of manufacturing a plurality of device chips according to a comparative example (Experiment B). In the comparative example, the second SiC substrate 13-2 that was cut had a diameter of 4 inches and a thickness of 100 μm. In the comparative example, the first cutting blade 40 was not vibrated, and the first cutting blade 40 as it was rotating was vertically moved to have its lower end placed in a vertical position between the face side 11a of the workpiece 11 and the holding surface 16a. The first cutting blade 40 cut the workpiece 11 whose reverse side 11b was exposed, fully thereacross all the way in one stroke, forming a cut groove, i.e., a dividing groove, in the workpiece 11.

In the comparative example, as a first cutting blade whose abrasive grains had an average particle diameter of 1.0 μm found it difficult to cut the workpiece 11, the first cutting blade 40 that was used had abrasive grains having an average particle diameter of 3.0 μm. The spindle rotational speed was 30000 rpm, the processing feed speed was 20 mm/s, the cutting mode was downward cutting, and the cutting water flow rate was 1.0 L/min. The first cutting blade 40 somehow managed to cut the workpiece 11 by being frequently dressed.

Figures 12A, 12B, 12C, 12D, 12E, 12F:
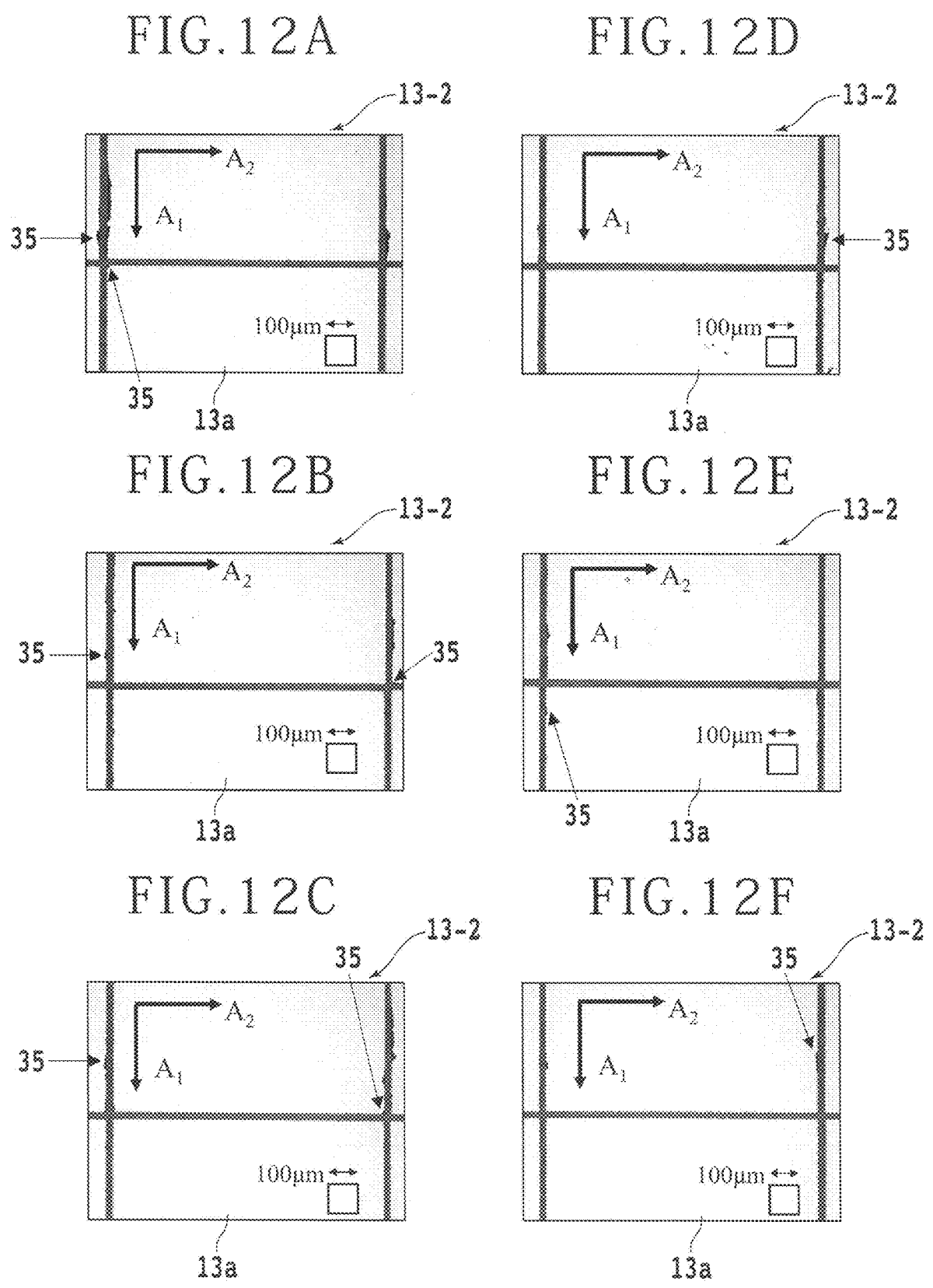

FIGS. 12A through 12F illustrates areas near the intersections of a plurality of dividing grooves in the C-surface 13b of the second SiC substrate 13-2. The intersections illustrated in FIGS. 12A through 12F are located at different positions on the second SiC substrate 13-2. FIG. 12A illustrates the 20th dividing groove among those dividing grooves that extend laterally, i.e., horizontally, in FIG. 12A. Similarly, FIG. 12B illustrates the 30th dividing groove, FIG. 12C illustrates the 40th dividing groove, FIG. 12D illustrates the 50th dividing groove, FIG. 12E illustrates the 60th dividing groove, and FIG. 12F illustrates the 70th dividing groove.

As illustrated in FIGS. 12A through 12F, the method according to the comparative example resulted in an increase in the number and size of chippings 35 compared with the method according to the first embodiment. In FIGS. 12A through 12F, representative chippings 35 are indicated by the arrows.

It is clear from a comparison between Experiments A and B that the number and size of chippings on the Si-surface 13a, i.e., the face side 11a of the workpiece 11, can greatly be reduced by vibrating the first cutting blade 40 at a frequency in the ultrasonic band in the cut groove forming step S10. In Experiment A, the chippings had sizes in the range of 3.0 μm to approximately 6.0 μm. In Experiment B, the chippings had sizes in the range of 10 μm to approximately 25 μm. Although not illustrated, the number and size of chippings on the C-surface 13b, i.e., the reverse side 11b of the workpiece 11, can also be reduced by applying the method according to the first embodiment.

Figure 13A:
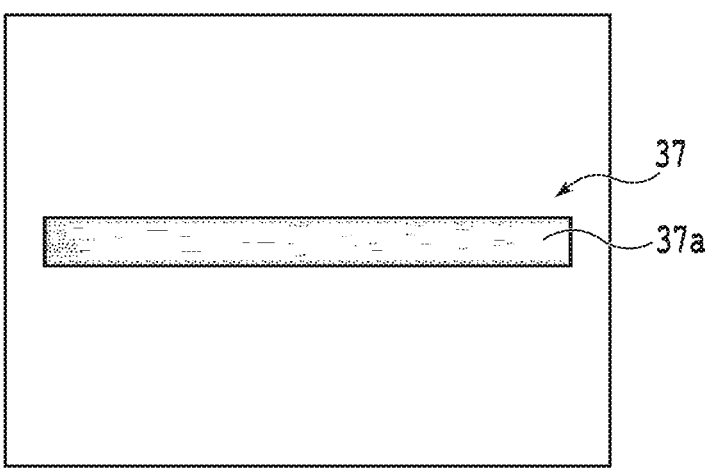
FIG. 13A is a cross-sectional view of the SiC substrate that has been divided by the method according to the first embodiment.
Figure 13B:
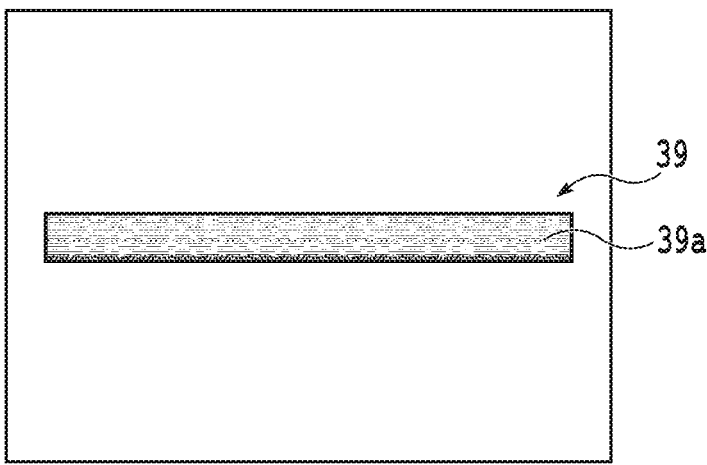
FIG. 13B is a cross-sectional view of the SiC substrate that has been divided by the method according to the comparative example.

FIG. 13A illustrates, in cross section, the SiC substrate 13 that has been divided by the method according to the first embodiment illustrated in FIGS. 11A through 11F, i.e., Experiment A described above, the view illustrating a cut surface 37a of an SiC chip 37. FIG. 13B illustrates, in cross section, the SiC substrate 13 that has been divided by the method according to the comparative example illustrated in FIGS. 12A through 12F, i.e., Experiment B described above, the view illustrating a cut surface 39a of an SiC chip 39.

The cut surfaces 37a and 39a illustrated in FIGS. 13A and 13B are illustrated as magnified 100 times by an optical microscope. Black lines that extend substantially longitudinally along the cut surfaces 37a and 39a represent recesses, i.e., chippings, formed in the cut surfaces 37a and 39a. A comparison of FIGS. 13A and 13B makes it clear that the vibrations of the first cutting blade 40 at a frequency in the ultrasonic band in the cut groove forming step S10 and the cutting of the SiC substrate 13 with the second cutting blade 84 in the subsequent dividing step S30 lead to a reduction in the number and size of chippings in the cut surfaces 37a and 39a, i.e., the side surfaces of the device chips 33.

Modification of First Embodiment

A modification of the first embodiment will be described below with reference to FIGS. 14A and 14B. The modification is different from the first embodiment in that the tape 23 is affixed to the reverse side (another surface) 11b and a surface of the frame 25 such that the face side (a surface) 11a is exposed, making up a workpiece unit 41 (see FIG. 14A), and the cut groove forming step S10 is carried out on the workpiece unit 41.

Figure 14A:
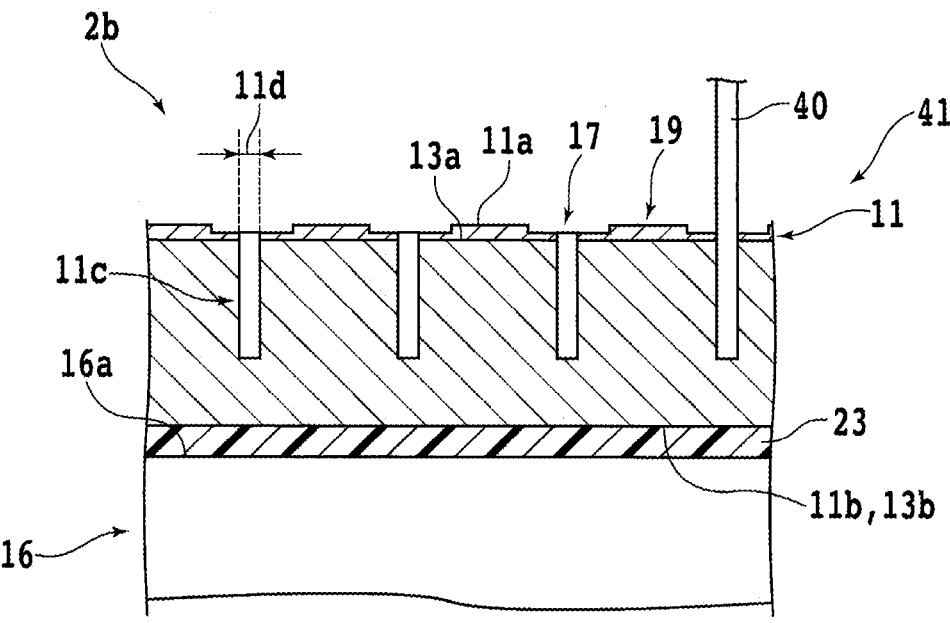
FIG. 14A is an enlarged fragmentary side elevational view, partly in cross section, illustrating a cut groove forming step of a method of manufacturing a plurality of device chips according to a modification of the first embodiment.

FIG. 14A illustrates, in enlarged fragmentary side elevation and partly in cross section, a cut groove forming step S10 according to the modification of the first embodiment. The cut groove forming step S10 according to the modification is carried out by using a cutting apparatus 2b that is different from the cutting apparatus 2 described above. The cutting apparatus 2b has the cutting unit 42 including the first cutting blade 40 and the ultrasonic vibrators 60a and 60b and includes a visible light camera, not illustrated, instead of the infrared camera 36.

Figure 14B:
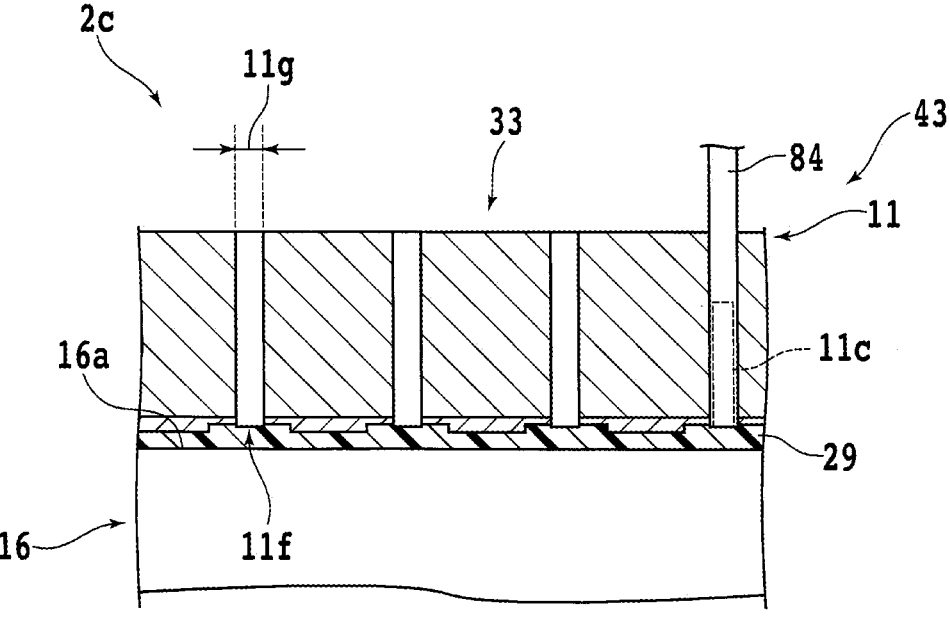
FIG. 14B is an enlarged fragmentary side elevational view, partly in cross section, illustrating a dividing step of the method according to the modification of the first embodiment.

After the cut groove forming step S10, in the workpiece overturning step S20, the tape 29 is affixed to the face side 11a and a surface of the frame 25, and the tape 23 affixed to the reverse side 11b is peeled off, making up a workpiece unit 43 (see FIG. 14B). After the workpiece overturning step S20, the dividing step S30 including the cutting position detecting step is carried out.

FIG. 14B illustrates, in enlarged fragmentary side elevation and partly in cross section, a dividing step S30 according to the modification of the first embodiment. The dividing step S30 according to the modification is carried out by using a cutting apparatus 2c that is different from the cutting apparatus 2a described above. The cutting apparatus 2c has the second cutting blade 84 and includes the infrared camera 36 instead of a visible light camera.

According to the modification, the workpiece 11 including the SiC substrate 13 can be divided into a plurality of device chips 33 by using the first cutting blade 40 and the second cutting blade 84, each having abrasive grains having a relatively small average particle diameter. In addition, the number and size of chippings near the face and reverse sides 11a and 11b of the workpiece 11 are reduced compared with a situation where the workpiece 11 is cut fully thereacross all the way and a situation where the cutting blade is not vibrated at a frequency in the ultrasonic band when the cutting blade forms half-cut grooves in the workpiece.

Second Embodiment

Figure 15:
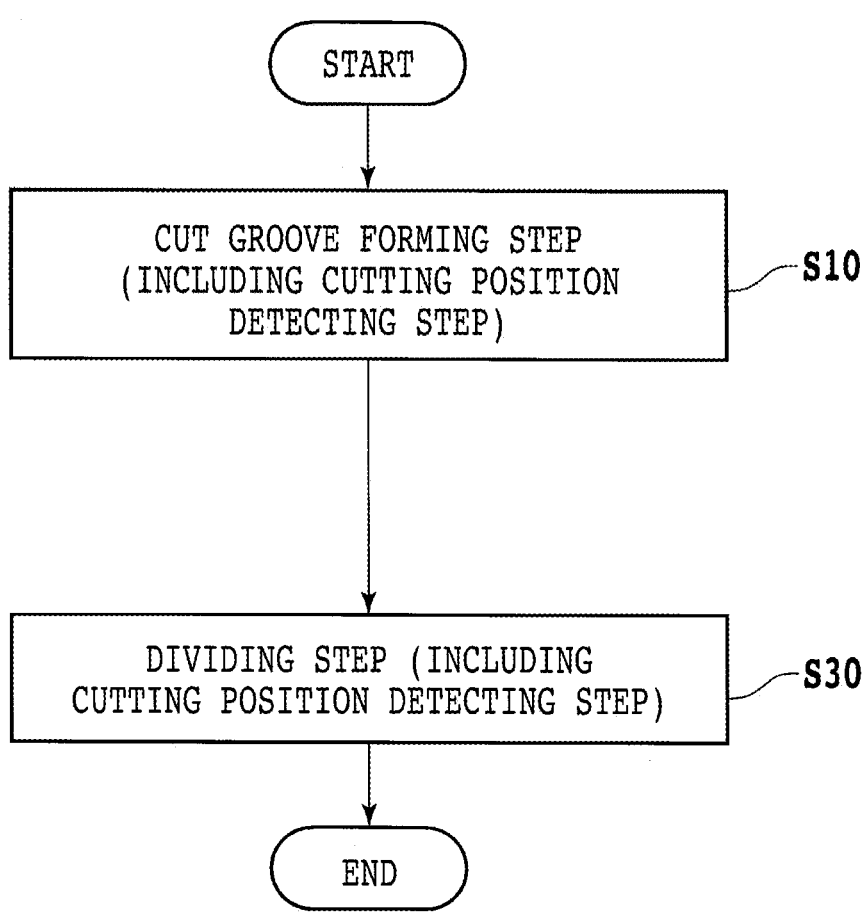
FIG. 15 is a flowchart of a method of manufacturing a plurality of device chips according to a second embodiment of the present invention.

A second embodiment of the present invention will be described below with reference to FIGS. 15 through 16B. FIG. 15 is a flowchart of a method of manufacturing a plurality of device chips 33 according to the second embodiment. According to the first embodiment, the workpiece 11 is cut stepwise by a bridge cutting step in which the dividing grooves 11f are formed contiguously to the cut grooves 11c. According the second embodiment, however, the workpiece 11 is cut stepwise by a stepwise cutting step performed on a workpiece unit 43' (see FIGS. 16A and 16B) where the tape 23 is affixed to the face side (another surface) 11a and a surface of the frame 25 such that the reverse side (a surface) 11b is exposed.

Figures 16A, 16B:
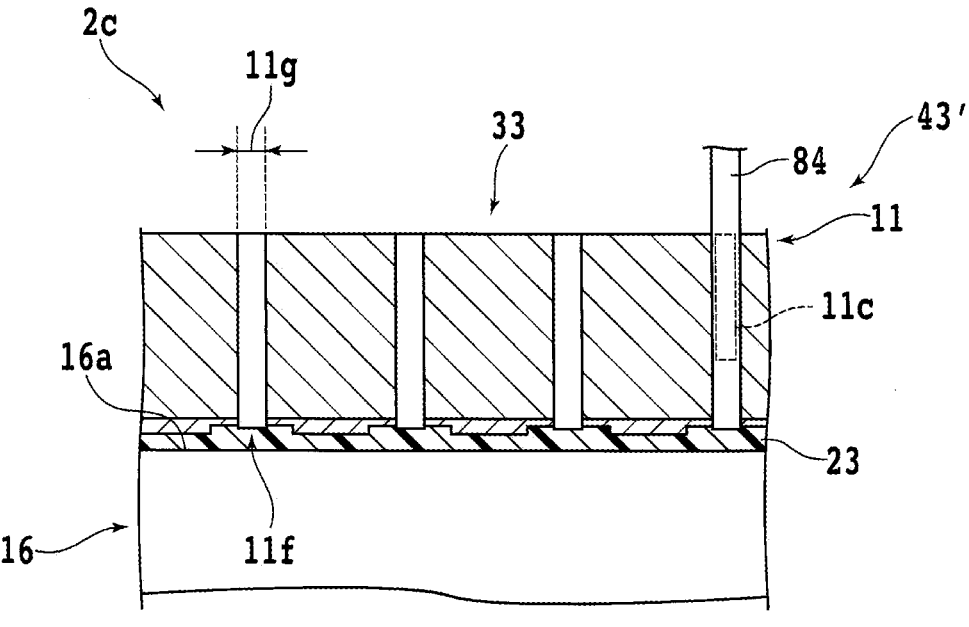
FIG. 16A is an enlarged fragmentary side elevational view, partly in cross section, illustrating a cut groove forming step of the method according to the second embodiment.
FIG. 16B is an enlarged fragmentary side elevational view, partly in cross section, illustrating a dividing step of the method according to the second embodiment.

FIG. 16A illustrates, in enlarged fragmentary side elevation and partly in cross section, a cut groove forming step S10 according to the second embodiment. The cut groove forming step S10 according to the second embodiment is carried out by using the cutting apparatus 2 (see FIG. 3) that has the cutting unit 42 including the first cutting blade 40 and the ultrasonic vibrators 60a and 60b and the infrared camera 36. According to the second embodiment, as illustrated in FIG. 15, after the cut groove forming step S10, the dividing step S30 is carried out, with the workpiece overturning step S20 being omitted.

FIG. 16B illustrates, in enlarged fragmentary side elevation and partly in cross section, a dividing step S30 according to the second embodiment. The dividing step S30 according to the second embodiment is carried out by using the cutting apparatus 2c (see FIG. 14B) that is free of the ultrasonic vibrators 60a and 60b for producing vibrations in the ultrasonic band but that includes the cutting unit 42 having the second cutting blade 84 mounted on the spindle 38 and the infrared camera 36.

According to the second embodiment, the number and size of chippings can be reduced to a certain extent though not as much as the first embodiment. According to the second embodiment, particularly, as no workpiece overturning step S20 is carried out, the workpiece 11 is prevented from cracking due to the workpiece overturning step S20. The reduced risk of cracking contributes to an increase in the yield of device chips 33.

Modification of Second Embodiment

A modification of the second embodiment will be described below with reference to FIGS. 17A and 17B. The modification is different from the second embodiment in that the tape 23 is affixed to the reverse side (another surface) 11*b* and a surface of the frame 25 such that the face side (a surface) 11*a* is exposed, making up a workpiece unit 41' (see FIG. 17A).

Figure 17A:
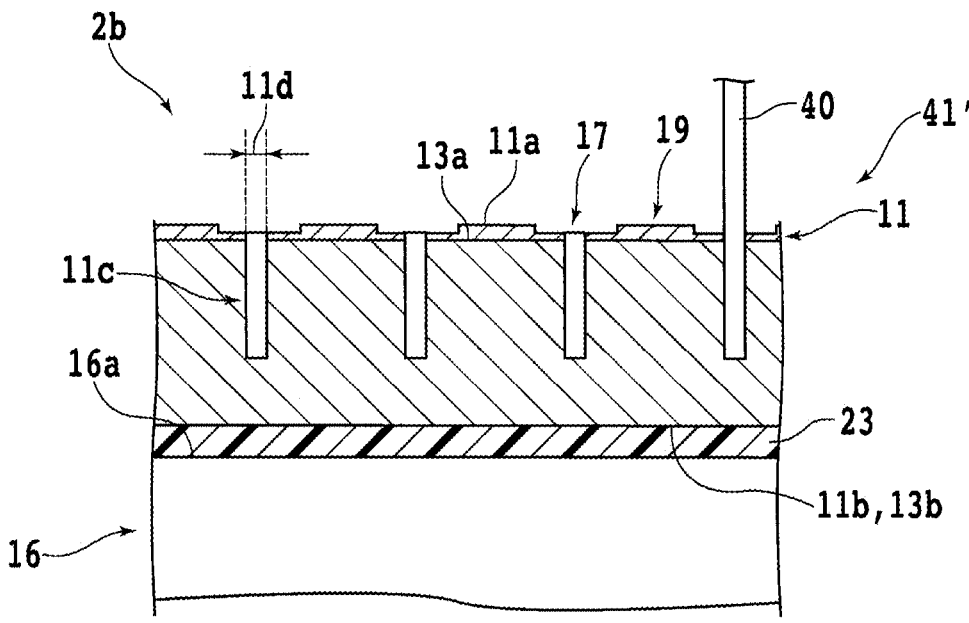
FIG. 17A is an enlarged fragmentary side elevational view, partly in cross section, illustrating a cut groove forming step of a method of manufacturing a plurality of device chips according to a modification of the second embodiment.

FIG. 17A illustrates, in enlarged fragmentary side elevation and partly in cross section, a cut groove forming step S10 according to the modification of the second embodiment. The cut groove forming step S10 according to the modification is carried out by using the cutting apparatus 2*b* (see FIG. 14A) that has the cutting unit 42 including the first cutting blade 40 and the ultrasonic vibrators 60*a* and 60*b* and the visible light camera, not illustrated. After the cut groove forming step S10, the dividing step S30 is carried out, with the workpiece overturning step S20 being omitted, as with the second embodiment.

Figure 17B:
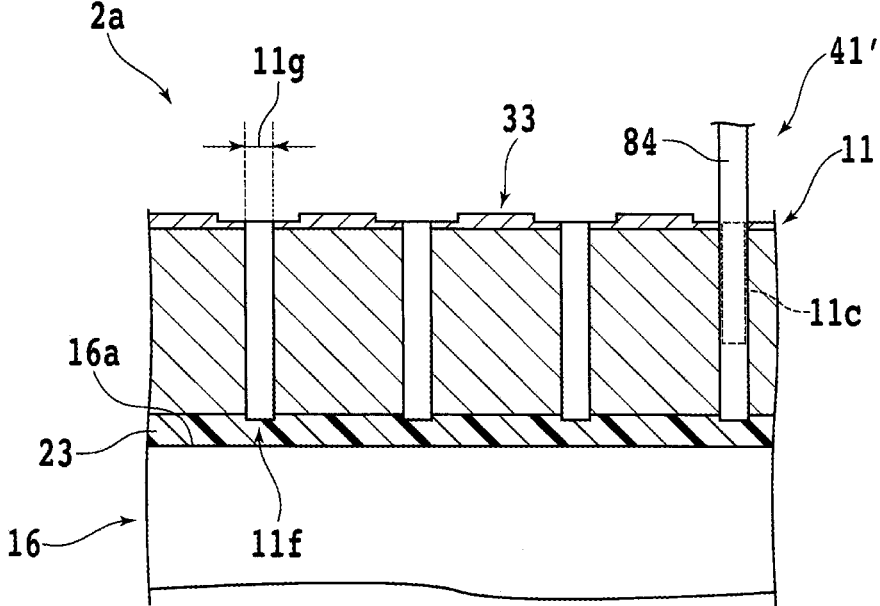
FIG. 17B is an enlarged fragmentary side elevational view, partly in cross section, illustrating a dividing step of the method according to the modification of the second embodiment.

FIG. 17B illustrates, in enlarged fragmentary side elevation and partly in cross section, a dividing step S30 according to the modification of the second embodiment. The dividing step S30 according to the modification is carried out by using the cutting apparatus 2*a* (see FIG. 10B) including the second cutting blade 84 and the visible light camera, not illustrated. Also according to the modification, the number and size of chippings can be reduced to a certain extent though not as much as the first embodiment, and, in addition, the workpiece 11 is prevented from cracking due to the workpiece overturning step S20.

Third Embodiment

Figure 18:
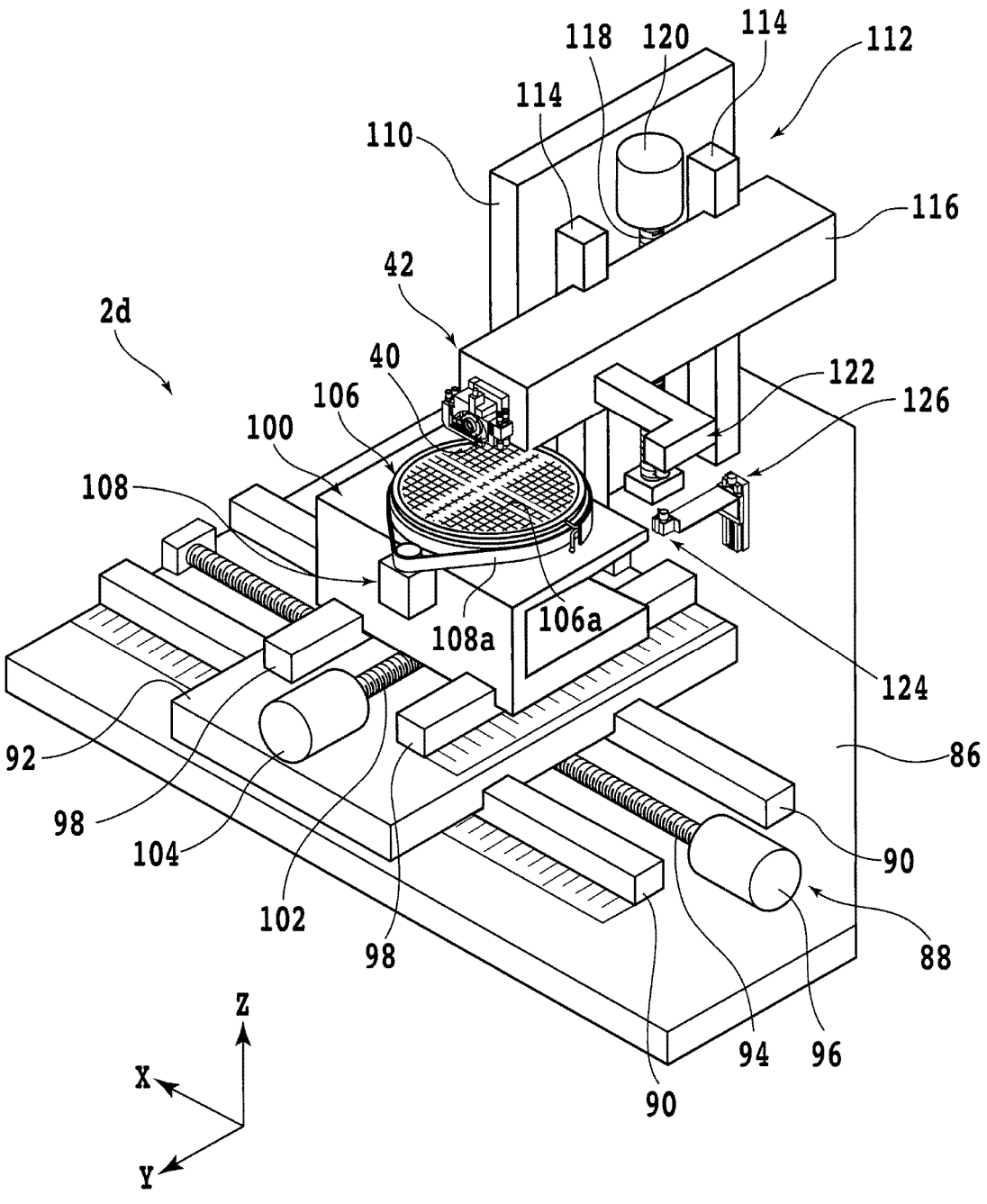
FIG. 18 is a perspective view of another cutting apparatus used in a method of manufacturing a plurality of device chips according to a third embodiment of the present invention.

A third embodiment will be described below with reference to FIGS. 18 through 19B. FIG. 18 illustrates, in perspective, a cutting apparatus 2*d* used in the third embodiment. In FIG. 18, the cutting apparatus 2*d* is illustrated in reference to a three-dimensional XYZ coordinate system similar to the three-dimensional XYZ coordinate system illustrated in FIG. 3. The cutting apparatus 2*d* has a base 86 supporting various components thereon. An X-axis and Y-axis moving mechanism 88 is disposed on an upper surface of the base 86. The X-axis and Y-axis moving mechanism 88 includes a pair of guide rails 90 extending substantially parallel to the X-axis. An X-axis movable table 92 is slidably mounted on the guide rails 90.

A nut, not illustrated, that is fixedly disposed on a reverse side, i.e., a lower surface, of the X-axis movable table 92 is operatively threaded over a screw shaft 94 extending substantially parallel to the X-axis and lying between the guide rails 90. The screw shaft 94 has an end coupled to a drive source 96 such as a stepping motor. A pair of guide rails 98 extending substantially parallel to the Y-axis are fixedly mounted on an upper surface of the X-axis movable table 92. A Y-axis movable table 100 is slidably mounted on the guide rails 98.

The Y-axis movable table 100 includes rectangular bottom and top plates that lie substantially parallel to the XY plane. The bottom and top plates have respective ends in a direction along the Y-axis that are connected to each other by a rectangular side plate that lies substantially parallel to an XZ plane defined along the X-axis and the Z-axis. The Y-axis movable table 100 is open at an end thereof in another direction along the Y-axis and at opposite sides in opposite directions along the X-axis. The bottom and top plates of the Y-axis movable table 100 define a space therebetween in which a lower visible light camera 124 to be described below can be inserted.

A nut, not illustrated, that is fixedly disposed on a lower surface of the bottom plate of the Y-axis movable table 100 is operatively threaded over a screw shaft 102 extending substantially parallel to the Y-axis and lying between the guide rails 98. The screw shaft 102 has an end coupled to a drive source 104 such as a stepping motor. The top plate of the Y-axis movable table 100 has a circular opening defined therein, and a chuck table, i.e., a holding table, 106 is disposed in the circular opening in the top plate. The chuck table 106 is rotatably supported on the top plate of the Y-axis movable table 100 for rotation about a rotational axis extending substantially parallel to the Z-axis.

The chuck table 106 is rotated about the rotational axis by rotational power transmitted from a rotary drive source 108 including a pulley via an endless belt 108*a* trained around an outer circumferential side surface of the chuck table 106. The chuck table 106 includes an annular frame made of a metal material such as stainless steel. A disk-shaped holder 106*a* is disposed in the opening of the annular frame. The holder 106*a* is made of a material that is substantially transparent to visible light, such as soda glass, borosilicate glass, or quartz glass. The holder 106*a* has a face side acting as an upper holding surface that is of a circular shape and lies substantially flatwise, and a reverse side that is opposite to the face side and that is also of a circular shape and lies substantially flatwise.

The holder 106*a* has a plurality of suction channels, not illustrated, defined therein to transmit a negative pressure therethrough and hold the workpiece 11 under suction thereon. The holder 106*a* also has a plurality of openings positioned at ends, i.e., upper ends, of the suction channels in an outer circumferential portion of the face side of the holder 106*a*. The openings are disposed at substantially equal spaced intervals circumferentially around the holder 106*a*. The suction channels have other ends, i.e., lower ends, fluidly connected to a suction source, not illustrated, such as a vacuum pump via a fluid channel, not illustrated. At least a region of the holder 106*a*, except the suction channels and the openings, extending from the face side to the reverse side of the holder 106*a* is substantially transparent to visible light.

A wall-shaped support structure 110 is disposed on the base 86 near the end of the Y-axis movable table 100 in the other direction along the Y-axis. A Z-axis moving mechanism 112 is mounted on a side surface of the support structure 110 that faces in one of the directions along the X-axis. The Z-axis moving mechanism 112 includes a pair of guide rails 114 extending substantially parallel to the Z-axis. A spindle housing 116 shaped as a rectangular parallelepiped that has a longitudinal axis extending substantially parallel to the Y-axis is slidably mounted on the guide rails 114 for sliding movement along the Z-axis.

A nut, not illustrated, that is fixedly disposed on a side surface of the spindle housing 116 that faces the support structure 110 is operatively threaded over a screw shaft 118 extending substantially parallel to the Z-axis and lying between the guide rails 114. The screw shaft 118 has an upper end coupled to a drive source 120 such as a stepping motor. The spindle 38 (see FIG. 4) whose longitudinal axis extends substantially parallel to the Y-axis has a portion rotatably supported in the spindle housing 116. The spindle 38 has a distal end portion on which the first cutting blade 40 (see FIG. 5) is mounted by the mount 44 and the presser flange 52.

The spindle 38, the first cutting blade 40, the ultrasonic vibrator 60a in the mount 44, the ultrasonic vibrator 60b in the presser flange 52, etc., jointly make up the cutting unit 42 described above. An upper visible light camera 122 that functions as a microscope camera is mounted on a side surface of the spindle housing 116 that faces in the one of the directions along the X-axis. The upper visible light camera 122 has one or more lenses, not illustrated, a light source, not illustrated, such as an LED for emitting visible light, and a solid-state image capturing device, i.e., a solid-state image sensor, not illustrated, for photoelectrically converting visible light into electric signals. The upper visible light camera 122 captures an image of the upper side of the workpiece 11 held under suction on the chuck table 106.

The lower visible light camera 124 that functions as a microscope camera is disposed below the spindle housing 116. The lower visible light camera 124 also has one or more lenses, not illustrated, a light source, not illustrated, such as an LED for emitting visible light, and a solid-state image capturing device, i.e., a solid-state image sensor, not illustrated, for photoelectrically converting visible light into electric signals. The lower visible light camera 124 is movable along the Z-axis by a ball-screw-type Z-axis moving mechanism 126 mounted on the base 86. However, the lower visible light camera 124 is fixed in position against movement parallel to the XY plane.

The lower visible light camera 124 captures an image of the lower side of the workpiece 11 held under suction on the chuck table 106. Specifically, while being inserted in the space in the Y-axis movable table 100, the lower visible light camera 124 captures an image of the lower side of the workpiece 11 through the holder 106a that is substantially transparent to visible light.

The cutting apparatus 2d includes a controller or a control unit, not illustrated, for controlling operations of the X-axis and Y-axis moving mechanism 88, the chuck table 106, the cutting unit 42, the Z-axis moving mechanism 112, the upper visible light camera 122, the lower visible light camera 124, and the Z-axis moving mechanism 126, in addition to the above-mentioned AC power supply 78, signal generator 80, etc. Since the controller is similar to the controller of the cutting apparatus 2, the controller will be omitted from detailed description.

Figure 19A:
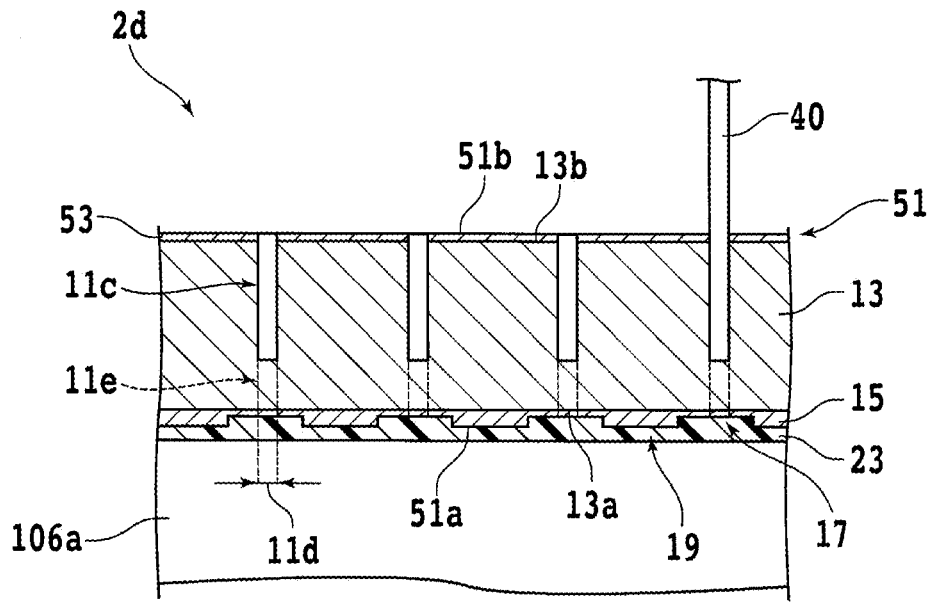
FIG. 19A is an enlarged fragmentary side elevational view, partly in cross section, illustrating a cut groove forming step of the method according to the third embodiment.

As illustrated in FIG. 19A, a workpiece 51 according to the third embodiment is different from the workpiece 11 described above in that a metal layer 53 is disposed in contact with the C-surface 13b of the SiC substrate 13 all over a reverse side 51b of the workpiece 51. Other details of the workpiece 51 are identical to those of the workpiece 11. The metal layer 53 functions, for example, as electrodes of the devices 19 and heat radiation plates of the device chips 33. The metal layer 53 may be of a laminated structure including laminated layers of a plurality of metals or a single-layer structure including a single layer of a metal.

The workpiece 51 has a face side 51a that corresponds to the face side 11a of the workpiece 11. The reverse side 51b of the workpiece 51 corresponds to the reverse side 11b of the workpiece 11. When the workpiece 51 is cut, the workpiece 51 is handled in the form of a workpiece unit where the workpiece 51 is supported on the frame 25 by the tape 23, as illustrated in FIG. 2B. According to the third embodiment, the workpiece 51 is cut by the cutting unit 42 while the workpiece 51 is being held under suction on the chuck table 106 such that the face side 51a faces the chuck table 106 and the metal layer 53 positioned over the reverse side 51b is exposed upwardly.

According to the third embodiment, the workpiece 51 is divided into device chips 33 according to the flowchart illustrated in FIG. 1, that is, by the bridge cutting step. FIG. 19A illustrates, in enlarged fragmentary side elevation and partly in cross section, a cut groove forming step S10 according to the third embodiment. According to the third embodiment, the lower visible light camera 124 captures an image of the face side 51a of the workpiece 51 through the holder 106a. Then, the controller detects the position, on the XY plane, of at least one of the projected dicing lines 17 on the basis of the coordinates of the key pattern that is included in the image of the face side 51a and the distances by which the key pattern is spaced from the projected dicing lines 17 (cutting position detecting step).

Thereafter, the chuck table 16 is turned about its central axis to make the one of the projected dicing lines 17 substantially parallel to the X-axis, thereby adjusting the orientation of the workpiece 51. While the workpiece 51 is being held under suction on the holder 106a, the first cutting blade 40 cuts the workpiece 51 along the projected dicing line 17, forming a cut groove 11c that extends from the reverse side 51b and terminates short of the face side 51a in the workpiece 11 along the projected dicing line 17 (cut groove forming step S10).

In the cut groove forming step S10, the first cutting blade 40 as it is rotating at a predetermined speed and vibrating at a frequency in the ultrasonic band is vertically moved to have its lower end placed in a vertical position between the reverse side 51b and the face side 51a of the workpiece 51. While the first cutting blade 40 is being supplied with cutting water such as pure water, the first cutting blade 40 is placed on an extension of the projected dicing line 17. Then, the chuck table 106 is moved along the X-axis to cause the first cutting blade 40 to cut the SiC substrate 13 and the metal layer 53 along the projected dicing line 17, forming a cut groove 11c in the workpiece 51 that extends from the reverse side 51b.

After the cut groove forming step S10, as illustrated in FIG. 9, the tape 29 is affixed to the reverse side 51b, and the tape 23 is peeled off from the face side 51a in the workpiece overturning step S20. After the workpiece overturning step S20, the dividing step S30 is carried out by using a cutting apparatus 2e (see FIG. 19B). The cutting apparatus 2e is essentially the same as the cutting apparatus 2d except that the cutting unit 42 is free of the ultrasonic vibrators 60a and 60b and the second cutting blade 84 is used in place of the first cutting blade 40.

Figure 19B:
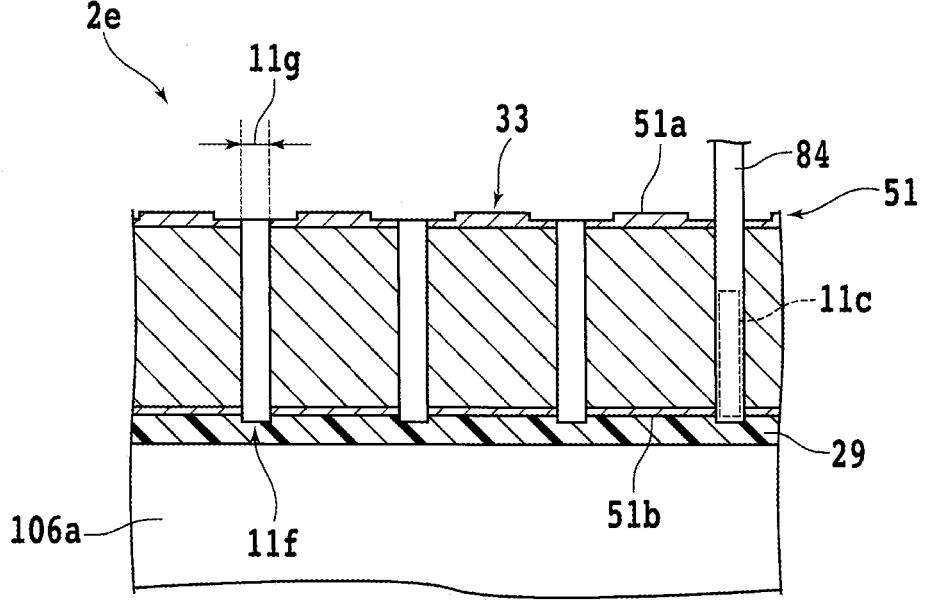
FIG. 19B is an enlarged fragmentary side elevational view, partly in cross section, illustrating a dividing step of the method according to the third embodiment.

FIG. 19B illustrates, in enlarged fragmentary side elevation and partly in cross section, a dividing step S30 according to the third embodiment. In the dividing step S30, while the workpiece unit is being held under suction on the chuck table 106, the upper visible light camera 122 captures an image of the face side 51a, and the position, on the XY plane, of at least one of the projected dicing lines 17 is detected on the basis of the captured image (cutting position detecting step). After the cutting position detecting step, the chuck table 106 is turned about its central axis to make the one of the projected dicing lines 17 substantially parallel to the X-axis, thereby adjusting the orientation of the workpiece 51. Then, the second cutting blade 84 cuts off the uncut residual portion 11e or the like near the face side 51a, dividing the workpiece 51 (dividing step S30).

Modification of Third Embodiment

A modification of the third embodiment will be described below with reference to FIGS. 20A and 20B. The modification is different from the third embodiment in that, in the cut groove forming step S10, the tape 23 is affixed to the reverse side (another surface) 51b and a surface of the frame 25 such that the face side (a surface) 51a is exposed, making up a workpiece unit.

Figure 20A:
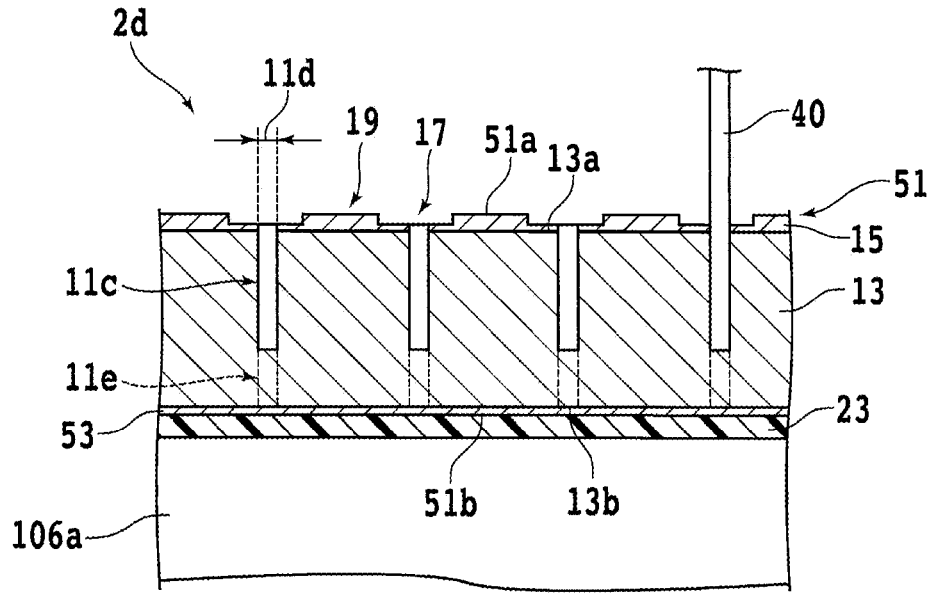
FIG. 20A is an enlarged fragmentary side elevational view, partly in cross section, illustrating a cut groove forming step of a method of manufacturing a plurality of device chips according to a modification of the third embodiment.

FIG. 20A illustrates, in enlarged fragmentary side elevation and partly in cross section, a cut groove forming step S10 according to the modification of the third embodiment. The cut groove forming step S10 according to the modification is carried out by using the cutting apparatus 2d having the cutting unit 42 that includes the first cutting blade 40 and the ultrasonic vibrators 60a and 60b. After the cut groove forming step S10, the workpiece overturning step S20, and then, the dividing step S30 are carried out.

Figure 20B:
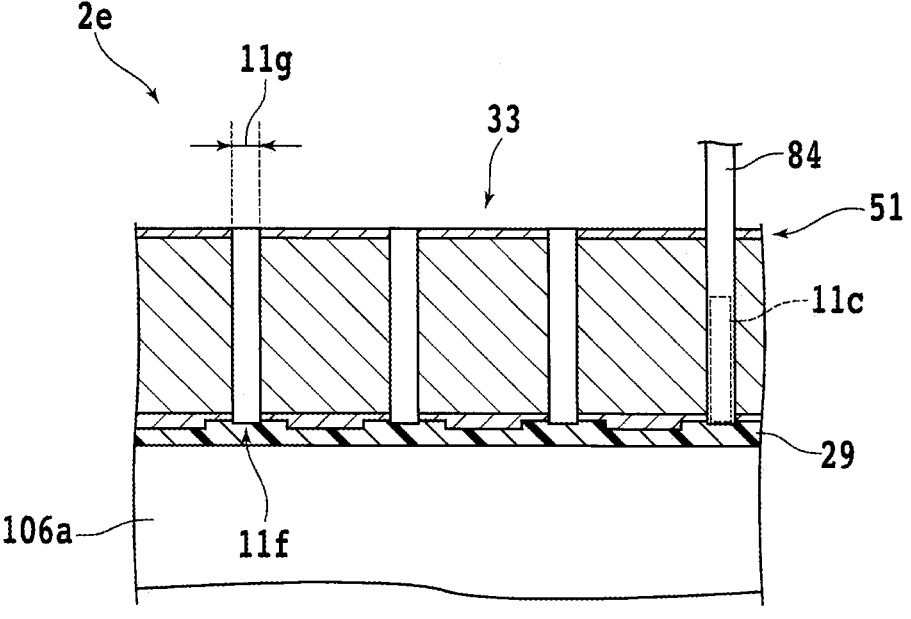
FIG. 20B is an enlarged fragmentary side elevational view, partly in cross section, illustrating a dividing step of the method according to the modification of the third embodiment.

FIG. 20B illustrates, in enlarged fragmentary side elevation and partly in cross section, a dividing step S30 according to the modification of the third embodiment. The dividing step S30 according to the modification is carried out by using the cutting apparatus 2e as with the third embodiment. In the cutting position detecting step, the lower visible light camera 124 is used. Also, according to the modification, the number and size of chippings can be reduced. According to the third embodiment and the modification thereof, the workpiece 51 is cut according to a sequence including the workpiece overturning step S20 (see FIG. 1, i.e., the bridge cutting step). However, the workpiece 51 may be cut according to a sequence free of the workpiece overturning step S20 (see FIG. 15, i.e., the stepwise cutting step).

The structures, methods, etc., according to the above embodiments and modifications may be changed or modified without departing from the scope of the present invention. The first cutting blade 40 and the second cutting blade 84 may be hub-type cutting blades instead of hubless cutting blades. A hub-type cutting blade includes an annular base made of a metal material such as aluminum alloy and an annular cutting edge extending along an outer circumferential edge portion of the annular base in integrally combination therewith. The cutting edge of the hub-type cutting blade is constructed as an electrodeposited grindstone made of abrasive grains bound together by a binder such as a nickel-plated layer, for example.

Instead of the ultrasonic vibrators 60a and 60b provided in the mount 44 and the presser flange 52 that are positioned on the distal end portion of the spindle 38, ultrasonic vibrators such as Langevin-type vibrators may be disposed in series longitudinally on the proximal end portion of the spindle 38. Moreover, a dual dicer, not illustrated, having the spindle 38 with the first cutting blade 40 mounted thereon and another spindle with the second cutting blade 84 mounted thereon may be used instead of the different cutting apparatuses in the cut groove forming step S10 and the dividing step S30.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing chips by dividing a workpiece having a substrate harder than a monocrystalline silicon substrate along a grid of projected dicing lines, the method comprising:
   a cut groove forming step of, while holding the workpiece on a holding table such that a surface of the workpiece is exposed, cutting the workpiece along each of the projected dicing lines with a first cutting blade as it is vibrating at a frequency in an ultrasonic band, to form a cut groove in the workpiece such that the cut groove extends from the surface of the workpiece and terminates short of another surface of the workpiece that is positioned opposite the surface thereof; and
   a dividing step of, after the cut groove forming step, while holding the workpiece on the holding table such that the other surface of the workpiece is exposed, cutting off an uncut residual portion from the workpiece along each of the projected dicing lines with a second cutting blade different from the first cutting blade to divide the workpiece into a plurality of chips.

2. The method of manufacturing chips according to claim 1, wherein
   the substrate includes a substrate of silicon carbide.

3. The method of manufacturing chips according to claim 1, wherein
   the other surface of the workpiece is a face side of the workpiece,
   the projected dicing lines are established on the face side and demarcate a plurality of rectangular areas on the face side, with devices provided in the respective rectangular areas,
   the surface of the workpiece is a reverse side of the workpiece,
   the workpiece has a metal layer disposed on the reverse side thereof,
   the cut groove forming step includes cutting the substrate and the metal layer to form the cut groove that extends from the reverse side of the workpiece, and
   the dividing step includes cutting off the uncut residual portion from the face side of the workpiece.

4. The method of manufacturing chips according to claim 1, wherein
   the second cutting blade has an edge thickness larger than an edge thickness of the first cutting blade, and
   the dividing step includes cutting the workpiece in order to increase a width of the cut groove.

5. The method of manufacturing chips according to claim 1, wherein
   the second cutting blade has abrasive grains whose average particle diameter is smaller than an average particle diameter of abrasive grains of the first cutting blade.

6. The method of manufacturing chips according to claim 1, wherein
   the cut groove forming step includes a cutting position detecting step of capturing an image of the other surface of the workpiece with an infrared camera from the surface of the workpiece and detecting at least one of the projected dicing lines on a basis of the captured image.

7. The method of manufacturing chips according to claim 1, wherein
   the holding table used in the cut groove forming step has a holder including at least a portion that is transparent to visible light from a face side to a reverse side thereof, and
   the cut groove forming step includes a cutting position detecting step of capturing an image of the other surface of the workpiece through the holder with a visible light camera and detecting at least one of the projected dicing lines on a basis of the captured image.

* * * * *